United States Patent
Yamada et al.

(10) Patent No.: US 7,901,863 B2
(45) Date of Patent: Mar. 8, 2011

(54) PHOTOSENSITIVE RESIN COMPOSITION FOR LASER ENGRAVABLE PRINTING SUBSTRATE

(75) Inventors: Hiroshi Yamada, Mishima (JP); Kei Tomeba, Fuji (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 622 days.

(21) Appl. No.: 10/587,315

(22) PCT Filed: Jan. 26, 2005

(86) PCT No.: PCT/JP2005/000953
§ 371 (c)(1),
(2), (4) Date: Jul. 26, 2006

(87) PCT Pub. No.: WO2005/070691
PCT Pub. Date: Aug. 4, 2005

(65) Prior Publication Data
US 2007/0160928 A1   Jul. 12, 2007

(30) Foreign Application Priority Data

Jan. 27, 2004 (JP) ................................. 2004-018470
Aug. 17, 2004 (JP) ................................. 2004-237600

(51) Int. Cl.
*G03F 7/075* (2006.01)
*G03F 7/012* (2006.01)
*G00F 7/027* (2006.01)

(52) U.S. Cl. ............... 430/270.1; 430/281.1; 430/286.1; 430/306

(58) Field of Classification Search ............... 430/270.1, 430/281.1, 300, 284.1, 286.1, 302, 306, 915
See application file for complete search history.

(56) References Cited

U.S. PATENT DOCUMENTS

| | | | |
|---|---|---|---|
| 4,218,498 A * | 8/1980 | Cohen ........................... | 427/336 |
| 4,426,431 A * | 1/1984 | Harasta et al. ................. | 430/14 |
| 5,061,598 A | 10/1991 | Abe et al. | |
| 5,310,869 A | 5/1994 | Lewis et al. | |
| 5,378,584 A * | 1/1995 | Frass et al. .................... | 430/165 |
| 5,798,202 A | 8/1998 | Cushner et al. | |
| 5,804,353 A | 9/1998 | Cushner et al. | |
| 6,797,455 B2 | 9/2004 | Hiller et al. | |
| 2003/0224281 A1 * | 12/2003 | Ishizuka et al. ............... | 430/157 |
| 2004/0157162 A1 * | 8/2004 | Yokota et al. ................. | 430/306 |

FOREIGN PATENT DOCUMENTS

| | | |
|---|---|---|
| JP | 56-64823 | 6/1981 |
| JP | 60-191238 | 9/1985 |
| JP | 3-118193 | 5/1991 |
| JP | 06-186740 | 7/1994 |
| JP | 7-276837 | 10/1995 |
| JP | 9-1916 | 1/1997 |
| JP | 9-146264 | 6/1997 |
| JP | 2846954 | 10/1998 |
| JP | 2846955 | 10/1998 |
| JP | 2001-121833 | 5/2001 |
| JP | 2002-292985 | 10/2002 |
| JP | 2003-528342 | 9/2003 |
| SU | 440952 | 9/1974 |
| SU | 798681 | 1/1981 |
| WO | WO 02/02346 A2 | 1/2002 |
| WO | WO 03/022594 * | 3/2003 |
| WO | WO 03/022594 A1 | 3/2003 |
| WO | WO 2005/005147 A1 | 1/2005 |

OTHER PUBLICATIONS

"Tegopren 7008", Evonik Industries, Juanuary 2008.*
The Chemical Daily Co., Ltd., 10889 Chemical Products, ISBN 4-87326-040-X, pp. 691-692, (1989).

* cited by examiner

*Primary Examiner* — Cynthia H Kelly
*Assistant Examiner* — Anca Eoff
(74) *Attorney, Agent, or Firm* — Finnegan, Henderson, Farabow, Garrett & Dunner, L.L.P.

(57) ABSTRACT

A photosensitive resin composition for a laser engravable printing substrate, comprising resin (a) having a polymerizable unsaturated group whose number average molecular weight is in the range of 1000 to $20 \times 10^4$, organic compound (b) having a polymerizable unsaturated group whose number average molecular weight is <1000 and organosilicon compound (c) having at least one Si—O bond in each molecule and having no polymerizable unsaturated group in molecules, wherein the content of organosilicon compound (c) is in the range of 0.1 to 10 wt. % based on the whole of photosensitive resin composition.

10 Claims, 1 Drawing Sheet

PHOTOSENSITIVE RESIN COMPOSITION FOR LASER ENGRAVABLE PRINTING SUBSTRATE

TECHNICAL FIELD

The present invention relates to a photosensitive resin composition for a printing substrate and a laser engravable printing substrate, which is suitable for formation of a relief image for a flexographic printing plate, a letterpress printing plate or screen printing by laser engraving, formation of a pattern for surface processing such as embossing, formation of a relief image for printing of a tile or the like, formation of a pattern of a conductor, a semiconductor or an insulator of an electronic component, formation of a pattern of a functional material such as an antireflection film of an optical component, a color filter or a (near) infrared cut filter, and further, formation of a coating film or a pattern of an alignment layer, a ground layer, a luminescent layer, an electron transport layer or a sealing material layer in production of a display element of a liquid crystal display, an organic electroluminescence display or the like, or a roll for adjusting the amount of ink, which is used in contact with an ink transferring blanket or an anilox roll which does not form a pattern.

BACKGROUND ART

Flexographic printing that is used for packaging materials such as corrugated boards, paper containers, paper bags and flexible packaging films, building and decoration materials such as wallpapers and decorative plates, label printing and the like has an increased proportion among a various kinds of printing processes. For fabrication of printing plates for use in the printing processes, normally, photosensitive resins are often used. For example, a process in which a liquid photosensitive resin or a solid photosensitive resin plate in the form of a sheet is used, a photo mask is placed on the photosensitive resin, light is applied through the mask to cause a crosslinking reaction, and non-crosslinked parts are then washed out with a developing solution has been used. In recent years, so called a flexographic CTP (Computer to Plate) technique of providing a thin light absorption layer called a black layer on the surface of a photosensitive resin, applying laser light to the layer to form a mask image directly on a photosensitive resin plate, then applying light through the mask to cause a crosslinking reaction, and then washing out non-crosslinked parts of areas to which no light is applied has been developed and increasingly employed in terms of the effect of improving efficiency of fabrication of a printing plate. However, this technique has a limited effect of improving the efficiency, and has a problem of absolutely requiring a developing step, and a technique in which a relief image is formed directly on a printing original plate and no developing step is required is desired.

A process for solving the problem is a process in which a printing original plate is directly subjected to laser engraving. Fabrication of letterpress printing plates and stamps by this process has already been conducted. As materials for use in this process, materials prepared by heating and curing synthetic rubbers such as EPDM and silicones have already been used. However, not only these materials require much time for production because it takes much time for heating and curing to achieve necessary mechanical properties, aging is further required until the properties become stable, and so on, but also the former materials using synthetic resins and the like as raw materials have a disadvantage that sculpture debris is stuck on the surface of a plate when the plate is subjected to laser engraving, and it is very difficult to remove the debris, and the latter materials using silicones as raw materials have a disadvantage that the speed of laser engraving is so low that it takes much time to fabricate a plate, the resistance to a solvent ink is low, and so on.

As a process for overcoming the disadvantages of the materials described above, a process for producing a laser engraved flexographic printing plate, in which laser light is applied to a cured photosensitive resin obtained by photo-curing a photosensitive resin composition to form an irregular pattern on the surface, has been proposed.

For example, Patent Document 1 (Japanese Patent No. 2846954 (U.S. Pat. No. 5,798,202)) and Patent Document 2 (Japanese Patent No. 2846955 (U.S. Pat. No. 5,804,353)) disclose use of a material prepared by mechanically, photochemically and thermochemically reinforcing a thermoplastic elastomer such as SBS, SIS or SEBS.

Patent Document 3 (JP-A-56-64823) discloses the use of roll material prepared by photo-curing a liquid photosensitive resin. Further, the present inventors have proposed in Patent Document 4 (WO 03-022594 Pamphlet) a laser engraved printing original plate using a liquid photosensitive resin composition containing a polymeric material that is a plastomer at 20° C., and proposed a process allowing improvements in which an inorganic porous material is made to coexist to inhibit generation of liquid debris caused by a laser, tacks on the surface of the plate are reduced, and an optical system is prevented from being contaminated.

Further, in recent years, demands for printing of continuous patterns have been increased, and in this application, development of a cylindrical printing substrate such as a seamless sleeve having no seams, which is easily subjected to laser engraving and capable of high quality printing, has come to be highly desired.

As described previously, the laser engraved original plate using a cured photosensitive resin has a good laser engraving characteristic as compared to vulcanized synthetic rubbers and silicone rubbers, and it is expected that the edge of an image will be so sharp that fine patterns can be formed, thus making it possible to meet high quality printing, but it is not sufficient. As a precondition for this, it is extremely important to ensure the accuracy of the thickness of the printing plate, and printing quality highly depends on the plate thickness accuracy before a laser engraving step. In the case of a laser engravable printing substrate, high film thickness accuracy can be ensured by subjecting the surface of a cured photosensitive resin obtained via a photo-curing step to surface processing such as cutting, grinding and polishing. Particularly, in the case of a cylindrical printing substrate such as a seamless sleeve, it can be placed in a printer to perform printing just after a pattern is formed by a laser engraving process, and therefore ensuring the plate thickness accuracy is an extremely important step in a process of fabricating a laser engravable printing substrate. Of course, the plate thickness accuracy is also important when a flat printing plate is wound around a cylinder of a printer to perform printing, and the same holds true for a sheeted original plate for laser engraving.

Patent Document 1 (Japanese Patent No. 2846954 (U.S. Pat. No. 5,798,202)) and Patent Document 2 (Japanese Patent No. 2846955 (U.S. Pat. No. 5,804,353)) describes a process in which a photosensitive resin composition molded in the form of a sheet is cylindrically wound, and joint areas are melted to be fused to achieve seamlessness. These documents also describe that fused areas can be polished. The present inventors have proposed in Patent Document 5 (PCT/JP 2004/005839) a process for producing a seamless cylindrical printing substrate using a liquid photosensitive resin, and proposed that surface processing such as cutting, grinding and polishing is carried out after curing by light.

The present inventors have examined surface processing processes such as cutting, grinding and polishing further in detail using the conventional photosensitive resin composition described previously, and as a result, it has been found that since sticky debris generated in these processes is deposited on the surface, and deposited sticky debris is hard to be removed, cutting and polishing marks may remain on the surface, and the processing accuracy of the obtained surface becomes so insufficient that a problem arises in printing quality especially when performing precise printing. The above described sticky debris is deposited on the surface of a cutting bite or a grinding wheel, and clings in some cases. It has been found that for avoiding these problems, carefully performing processing, such as stopping working to clean out or remove deposited debris when the sticky debris clings to the cutting bite or the grinding wheel, is required, and therefore a considerable amount of time is required for processing.

The process proposed by the present inventors in the aforementioned Patent Documents 3 and 5 in which a liquid photosensitive resin composition is used at 20° C. is a quite excellent process in that owing to a characteristic of a liquid form, the photosensitive resin composition is easily molded and can adapt to either a sheet form or sleeve form by a simple process such as coating using a blade, but it has been newly found that due to limitations on a resin design for liquefying a resin curing, a printing plate sculptured with a laser after curing has a problem of being prone to occurrence of "ink bridging" in which an ink remains in areas between formed relief patterns to degrade printing quality.

There are several proposals as conventional techniques for improving the surface characteristic of a photosensitive resin plate for printing although they are not techniques relating to a laser engravable printing substrate. For example, Patent Document 6 (JP-A-6-186740) describes a printing substrate capable of aqueous development for forming irregular patterns on the surface using a photoengraving technique, and describes that to a photosensitive resin is added a silicone compound having a polymerizable unsaturated group copolymerizing with the resin. As an effect of adding the above described silicone compound, inhibition of deposition of a dry ink and a paper powder on areas between formed relief patterns is described. However, Patent Document 6 relates to production of a printing plate using a photoengraving technique, but does not relate to a laser engravable printing substrate. If the silicone compound added for the purpose of control of wettability of the surface of the printing plate which is used in this patent document has a large number of polymerizable unsaturated groups, there is the concern that the density of crosslinking points increases to increase the hardness of the cured photosensitive resin or increase a photocuring contraction coefficient. The present inventors examined "ink bridging" using the silicone compound described in Patent Document 6, resultantly found that since the silicone compound is easily transferred to the surface of the cured photosensitive resin and fixed on the surface during photocuring, the surface is made excessively hydrophobic, and therefore rejects a solvent such as alcohol which is widely used in a solvent ink or the like, and recognized this as a problem in ensuring high printing quality.

A process in which the surface of a flexographic printing plate using a photosensitive resin is treated has also been proposed. Studies are conducted for the purpose of inhibiting a phenomenon in which an ink deposited on the surface of the plate during printing remains, and cannot be removed as it is trapped between fine patterns such as dots, thin letters and thin lines, and the remaining ink is transferred to printed matter to cause ink stains on non-image areas. This phenomenon tends to occur particularly in the case of printing over an extended period of time or if a pressure applied between the anilox roll and the plate is high when transferring an ink to the plate surface, and ink stains on non-image areas raise a serious problem in terms of printing quality. If such ink stains occur, a printer should be stopped to clean the plate surface, and productivity at a printing site is thus considerably impaired. A process in which a mixture of an aqueous emulsion of a silicone compound or a fluorine compound and an aqueous resin is coated is proposed in Patent Document 7 (JP-A-2002-292985), but the effect on the remaining of an ink on the plate surface is not necessarily sufficient because an aqueous solution having a low seepage force is coated. There is also a problem as to the persistence of the effect.

Patent Document 8 (JP-A-60-191238) describes an image reproduction material having a photosensitive resin layer, a scratch resistance layer and a protective layer, and describes that a silicone oil is included in the photosensitive resin layer and the silicone oil is transferred to the surface of the photosensitive resin layer to form a scratch layer. Patent Document 8 describes as one of applications a photosensitive resin letterpress on which irregular patterns are formed via light exposure and development steps, but this is not a laser engraving plate on which patterns are formed using the laser engraving process. For the added silicone oil, a compound that is easily transferred from the inside of the resin to the surface is selected, and therefore it is presumed that the silicone oil is not fixed in the resin. Thus, when the above described image forming material is used as a printing plate, there is a problem such that the silicone oil is extracted with a solvent in an ink used, and it is therefore difficult to maintain the scratch resistance effect for a long time.

Thus, the present inventors have recognized as two serious problems the problem as to removal of sticky debris generated in surface processing steps such as cutting, grinding and polishing in a step of producing a laser engravable printing substrate, which is composed of a cured photosensitive resin, and the problem of "ink bridging" between relief patterns of the laser engravable printing substrate. There is not a conventional technique for which a process capable of solving these two serious problems at the same time is described.

Patent Document 1: Japanese Patent No. 2846954
Patent Document 2: Japanese Patent No. 2846955
Patent Document 3: JP-A-56-64823
Patent Document 4: WO 03/022594 A
Patent Document 5: PCT/JP2004/005839
Patent Document 6: JP-A-6-186740
Patent Document 7: JP-A-2002-292985
Patent Document 8: JP-A-60-191238

DISCLOSURE OF THE INVENTION

Problem to be Solved by the Invention

It is an object of the present invention to provide a photosensitive resin composition suitable for production of a laser engravable printing substrate which is composed of a cured photosensitive resin, wherein removal of sticky debris generated in surface processing steps such as cutting, grinding and polishing is easy, and the printing substrate inhibiting ink stains on the printing substrate, improving the abrasion resistance and inhibiting tacks on the surface.

Means for Solving the Problem

As a result of conducting vigorous studies for solving the aforementioned problems, the present inventors have found that when an organic silicon compound (c) having at least one Si—O bond and no polymerizable unsaturated group in a molecule is added to a photosensitive resin composition in an amount of 0.1 wt % or more and 10 wt % or less based on the total amount of the photosensitive resin composition, a surprising effect in which in a cured material obtained by photo-crosslinking and curing the photosensitive resin composition, tacks on the surface and the surface friction resistance are reduced, the abrasion resistance is dramatically improved and further, the remaining of an ink on the plate surface during printing is provided, and completed the present invention.

The present invention is as follows.

1. A photosensitive resin composition for a laser engravable printing substrate, which comprises a resin (a) having a polymerizable unsaturated group having a number average molecular weight of 1000 or more and 200000 or less, an organic compound (b) having a polymerizable unsaturated group having a number average molecular weight of less than 1000, and an organic silicon compound (c) having at least one Si—O bond in a molecule and having no polymerizable unsaturated group in the molecule, wherein a content of the organic silicon compound (c) is 0.1 wt % or more and 10 wt % or less based on the total amount of the photosensitive resin composition.

2. The photosensitive resin composition set forth in item 1, wherein the above described organic silicon compound (c) has a number average molecular weight of 100 or more and 100000 or less, and is liquid at 20° C.

3. The photosensitive resin composition set forth in item 1, wherein the above described organic silicon compound (c) comprises a silicone compound represented by the average composition formula (1):

$$R_p Q_r X_s SiO_{(4-p-r-s)/2} \quad (1)$$

wherein R represents one or more hydrocarbon groups selected from the group consisting of a linear or branched alkyl group(s) having 1 to 30 carbon atoms, a cycloalkyl group(s) having 5 to 20 carbon atoms, an alkyl group(s) having 1 to 30 carbon atoms (the number of carbon atoms before the alkyl group is substituted) unsubstituted or substituted with alkyl group(s) having 1 to 20 carbon atoms, an alkoxy group(s) having 1 to 20 carbon atoms or an aryl group, an aryl group(s) substituted with a halogen atom and having 6 to 20 carbon atoms, an alkoxycarbonyl group(s) having 2 to 30 carbon atoms, a monovalent group(s) containing a carboxyl group or a salt thereof, a monovalent group(s) containing a sulfo group or a salt thereof, and a polyoxyalkylene group(s), Q and X each represent one or more hydrocarbon groups selected from the group consisting of a hydrogen atom, a linear or branched alkyl group(s) having 1 to 30 carbon atoms, a cycloalkyl group(s) having 5 to 20 carbon atoms, an alkyl group(s) having 1 to 30 carbon atoms unsubstituted or substituted with alkyl group(s) having 1 to 20 carbon atoms, an alkoxy group(s) having 1 to 20 carbon atoms or an aryl group, an aryl group(s) substituted with a halogen atom and having 6 to 20 carbon atoms, an alkoxycarbonyl group(s) having 2 to 30 carbon atoms, a monovalent group(s) containing a carboxyl group or a salt thereof, a monovalent group(s) containing a sulfo group or a salt thereof, and a polyoxyalkylene group(s), and p, r and s are numbers satisfying the formulas:

$$0 < p < 4,$$

$$0 \leq r < 4,$$

$$0 \leq s < 4, \text{ and}$$

$$(p+r+s) < 4.$$

4. The photosensitive resin composition set forth in item 3, wherein the above described silicone compound comprises a compound having at least one organic group selected from the group consisting of an aryl group, a linear or branched alkyl group substituted with at least one aryl group, an alkoxycarbonyl group, an alkoxy group and a polyoxyalkylene group, and having a hydrogen atom (α position hydrogen) bonded to a carbon atom to which the organic group is directly bonded.

5. The photosensitive resin composition set forth in item 4, wherein the above described silicone compound has at least one organic group selected from the group consisting of a methylstyryl group, a styryl group and a carbinol group.

6. The photosensitive resin composition set forth in item 1, wherein the above described organic silicon compound (c) comprises a compound having at least one organic group selected from the group consisting of an aryl group, a linear or branched alkyl group substituted with at least one aryl group, an alkoxycarbonyl group, an alkoxy group and a polyoxyalkylene group, and having a hydrogen atom (α position hydrogen) bonded to a carbon atom to which the organic group is directly bonded.

7. The photosensitive resin composition set forth in item 1, wherein further comprising a photopolymerization initiator, wherein the photopolymerization initiator comprises at least one hydrogen extraction photopolymerization initiator (d).

8. The photosensitive resin composition set forth in item 7, wherein the above described photopolymerization initiator comprises at least one hydrogen extraction photopolymerization initiator (d) and at least one degradable photopolymerization initiator (e).

9. The photosensitive resin composition set forth in item 8, wherein the above described hydrogen extraction photopolymerization initiator (d) comprises at least one compound selected from the group consisting of benzophenones, xanthenes and anthraquinones, and the above described degradable photopolymerization initiator (e) comprises at least one compound selected from the group consisting of benzoin alkyl ethers, 2,2-dialkoxy-2-phenylacetophenones, acyloxime esters, azo compounds, organic sulfur compounds and diketones.

10. The photosensitive resin composition set forth in item 7 or 8, wherein the above described photopolymerization initiator comprises a compound having both of a site functioning as the hydrogen extraction photopolymerization initiator and a site functioning as the degradable photopolymerization initiator in the same molecule.

11. The photosensitive resin composition set forth in item 1, wherein the above described resin (a) is liquid at 20° C., and the above described resin (a) and/or the above described organic compound (b) are compounds having a molecular chain having at least one bond selected from a carbonate bond, an ester bond and an ether bond, and/or having at least one molecular chain selected from the group consisting of an aliphatic saturated hydrocarbon chain and an aliphatic unsaturated hydrocarbon chain, and having an urethane bond.

12. The photosensitive resin composition set forth in item 1, wherein a coating layer of the photosensitive resin composition having a thickness of 1 mm has a haze of 0% or more and 70% or less.

13. The photosensitive resin composition set forth in 1, which is liquid at 20° C.

14. A laser engravable printing substrate obtained by photo-curing a photosensitive resin composition, wherein the printing substrate comprises an organic silicon compound in an interior and/or on a surface thereof, and Si atoms originating from the organic silicon compound is contained in an abundance ratio of 0.01 wt % or more and 10 wt % or less when the organic silicon compound is detected and quantitatively determined using solid $^{29}$SiNMR (solid nuclear resonance spectrometry in which an observed nucleus is Si having an atomic weight of 29) and plasma emission spectrometry in combination.

15. A laser engravable printing substrate, which can be obtained by molding the photosensitive resin composition set forth in item 1 into a sheet or cylinder and then crosslinking and curing the sheet or cylinder by applying light.

16. The laser engravable printing substrate set forth in item 14 or 15, having a surface subjected to at least one processing selected from the group consisting of cutting processing, grinding processing, polishing processing and blast processing after crosslinking and curing by application of light.

17. The laser engravable printing substrate set forth in item 16, wherein an elastomer layer is formed by curing the photosensitive resin composition that is liquid at normal temperature.

18. The laser engravable printing substrate set forth in item 16, wherein an outermost surface layer of a laminate is a layer which can be engraved using a near infrared laser.

19. A laser engravable printing substrate comprising a photosensitive resin composition, wherein the laser engravable printing substrate has a surface with a wettability characteristic such that when 20 μl of an indicating liquid with a surface energy of 30 mN ("Wetting Tension Test Mixture No. 30.0" (trademark) manufactured by Wako Pure Chemical Industries, Ltd.) collected using a quantitative and fixed type micropipette is added dropwise onto the surface and a maximum diameter of an area where the above described droplet spreads is measured after 30 seconds, the diameter of the droplet is 4 mm or more and 20 mm or less.

20. The laser engravable printing substrate set forth in any one of items 14 to 20, which is a flexographic printing original plate or a letterpress printing original plate or a screen printing original plate on which patterns are formed using a laser engraving process, or an ink amount adjusting roll which is used in contact with an ink transferring blanket or an anilox roll on which no patterns are formed.

ADVANTAGES OF THE INVENTION

The present invention can provide a photosensitive resin composition suitable for production of a laser engravable printing substrate which is composed of a cured photosensitive resin, wherein removal of sticky debris generated in surface processing steps such as cutting, grinding and polishing is easy, and the printing substrate inhibiting ink stains on the printing substrate, improving the abrasion resistance and inhibiting tacks on the surface.

BEST MODE FOR CARRYING OUT THE INVENTION

Figure 1:
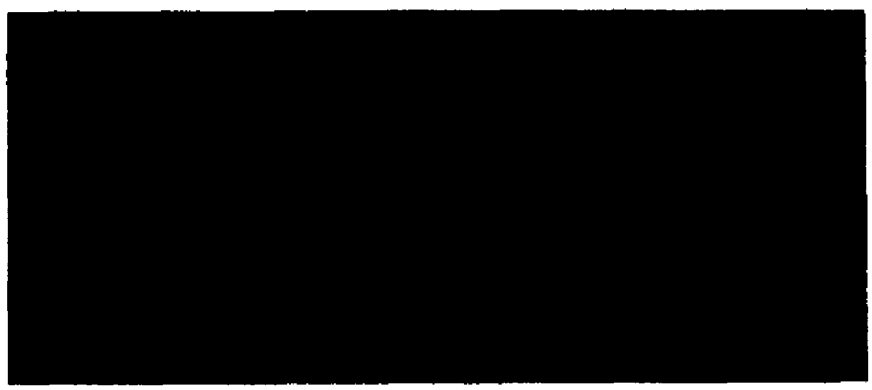
FIG. 1 is a photograph of the surface of a plate after evaluation of printing in Example 1 of the present invention.

Preferred embodiments of the present invention will be described further in detail below.

An organic silicon compound (c) for use in the present invention is defined as a compound having at least one organic functional group per silicon atom. The organic silicon compound (c) used preferably has at least one Si—O bond in a molecule. A silicone compound having a siloxane structure or a polysiloxane structure having a Si—O—Si bond is especially preferable in terms of weather resistance, structural stability and storage stability.

The organic silicon compound (c) of the present invention is preferably a compound having no polymerizable unsaturated group in a molecule. In the present invention, the "polymerizable unsaturated group" is defined as a polymerizable unsaturated group involved in a radical or addition polymerization reaction. Preferable examples of polymerizable unsaturated groups involved in the radical polymerization reaction include a vinyl group, an acetylene group, an acryl group and a methacryl group. Preferable examples of polymerizable unsaturated groups involved in the addition polymerization reaction include a cinnamoyl group, a thiol group, an azido group, an epoxy group which undergoes a ring-opening addition reaction, an oxethane group, a cyclic ester group, a dioxysilane group, a spiroorthocarbonate group, a spiroorthoester group, bicycloorthoester group and a cyclic iminoether group.

In the present invention, preferable silicone compounds include at least one silicone compound containing at least one structure of silicone bonds represented by, for example, general formula (2), (3), (4) or (5).

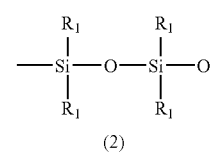

[Formula 1]

(2)

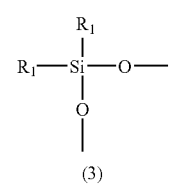

[Formula 2]

(3)

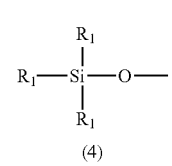

[Formula 3]

(4)

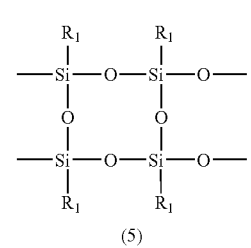

[Formula 4]

(5)

(In the formulae, $R_1$ each independently represents one or more hydrocarbon groups selected from the group consisting of a hydrogen atom, linear or branched alkyl groups having 1 to 30 carbon atoms, cycloalkyl groups having 5 to 20 carbon atoms, an alkyl group(s) having 1 to 30 carbon atoms (the number of carbon atoms before the alkyl group is substituted) unsubstituted or substituted with alkyl group(s) having 1 to 20 carbon atoms, an alkoxy group(s) having 1 to 20 carbon atoms or an aryl group, aryl groups substituted with a halogen atom and having 6 to 20 carbon atoms, alkoxy carbonyl groups having 2 to 30 carbon atoms, monovalent groups containing a carboxyl group or a salt thereof, monovalent groups containing a sulfo group or a salt thereof, and polyoxyalkylene groups.)

The above described silicone compound is represented by the average composition formula (1).

$$R_pQ_rX_sSiO_{(4-p-r-s)/2} \quad (1)$$

(In the formula, R represents one or more hydrocarbon groups selected from the group consisting of linear or branched alkyl groups having 1 to 30 carbon atoms, cycloalkyl groups having 5 to 20 carbon atoms, an alkyl group(s) having 1 to 30 carbon atoms (preferably 2 to 30 carbon atoms) (the number of carbon atoms before the alkyl group is substituted) unsubstituted or substituted with alkyl group(s) having 1 to 20 carbon atoms, an alkoxy group(s) having 1 to 20 carbon atoms or an aryl group, aryl groups substituted with a halogen atom and having 6 to 20 carbon atoms, alkoxycarbonyl groups having 2 to 30 carbon atoms, monovalent groups containing a carboxyl group or a salt thereof, monovalent groups containing a sulfo group or a salt thereof, and polyoxyalkylene groups.

Q and X each represent one or more hydrocarbon groups selected from the group consisting of hydrogen, linear or branched alkyl groups having 1 to 30 carbon atoms, cycloalkyl groups having 5 to 20 carbon atoms, an alkyl group(s) having 1 to 30 carbon atoms (the number of carbon atoms before the alkyl group is substituted) unsubstituted or substituted with alkyl group(s) having 1 to 20 carbon atoms, an alkoxy group(s) having 1 to 20 carbon atoms or an aryl group, aryl groups substituted with a halogen atom and having 6 to 20 carbon atoms, alkoxycarbonyl groups having 2 to 30 carbon atoms, monovalent groups containing a carboxyl group or a salt thereof, monovalent groups containing a sulfo group or a salt thereof, and polyoxyalkylene groups, and p, r and s are numbers satisfying the formulas:

$0<p<4$, $r \leq r<4$, $0 \leq s<4$, and $(p+r+s)<4$.)

The molecular structure of the above described silicone compound is not specifically limited, but preferable compounds may include compounds having a polyalkylsiloxane such as polydimethylsiloxane or polydiethylsiloxane in a main chain. It may also be a compound having a polysiloxane structure as a part of a molecule. Further, a compound having a specific organic group introduced in a polysiloxane structure may be used. Specifically, a compound having an organic group introduced in a side chain of polysiloxane, a compound having organic groups introduced at opposite ends of polysiloxane, a compound having an organic group introduced at one end of polysiloxane, a compound having organic groups introduced in a side chain and at ends of polysiloxane, or the like may be used. Specific examples of organic groups which are introduced in the polysiloxane structure may include an amino group, a carboxyl group, a carbinol group, an aryl group, an alkyl group, an alkoxycarbonyl group, an alkoxy group, a linear or branched alkyl group substituted with at least one aryl group, and a polyoxyalkylene group. Here, preferable examples of the aryl group may include a phenyl group, a tolyl group, a xylyl group, a biphenyl group, a naphthyl group, an antryl group, a pylenyl group and phenanetryl group. Linear or branched alkyl groups substituted with an aryl group, for example a methylstyryl group and a styryl group are preferable. Further, an organic group in which hydrogen atoms bonded to aromatic carbon of the aryl group are substituted with other functional groups may be used. A compound in which some or all of hydrogen atoms bonded to these organic groups are substituted with halogen atoms such as a fluorine atom, a chlorine atom and a bromine atom may also be used.

As the organic silicon compound (c) for use in the present invention, especially preferable are compounds having at least one organic group selected from the group consisting of a phenyl group, a methylstyryl group, a styryl group, an alkoxycarbonyl group, an alkoxy group and a polyoxyalkylene group, and having a compound having a hydrogen atom bonded to a carbon atom to which the organic group is directly bonded, i.e. a hydrogen atom bonded to α position carbon of a linear compound (hereinafter abbreviated as α position hydrogen). These compounds are added in the photosensitive resin composition as an additive. If photocrosslinking and curing is performed using these compounds, the amount of components extracted in an ink for se in a printing step from the obtained cured material is extremely small, and the persistence of the effect of inhibiting the remaining of an ink on the plate surface and further the curing of reducing the friction resistance of the plate surface is extremely high. A phenomenon in which when a cured material obtained by subjecting a photosensitive resin composition containing these compounds to a photopolymerization reaction is immersed in a solvent, a change in weight before and after the immersion is small is observed, although the reason for this has not been clarified. This means that the amount of components eluted in the ink used at the time of printing is small, and when the printing step is repeatedly carried out, a change in mechanical properties and a change in printing properties of the plate can be reduced, and it is extremely important in terms of practical properties. The present inventors assume that the reason for occurrence of this phenomenon is that a compound having a position hydrogen contributes to some reaction in a photopolymerization reaction process, and captured in the cured material by a chemical reaction.

As the organic silicon compound (c) of the present invention, a compound which does not become opaque or of which the degree of opacity is low when mixed with the photosensitive is preferable. There is a haze measured using a haze meter as an index for determining the degree of opacity. The range of the haze is preferably from 0% or more to 70% or less, more preferably from 0% or more to 50% or less, further preferably from 0% or more to 40% or less.

As the organic silicon compound (c) of the present invention, commercial products that are normally available, for example various kinds of silicone oils substituted with an organic group manufactured by Shin-Etsu Chemical Co., Ltd., Wacker Asahikasei Silicone Co., Ltd., GE Toshiba Silicones Co., Ltd. and Dow Corning Silicone Toray Co., Ltd. may also be used. Examples of useful compounds may include, for example, methylstyryl-modified silicone oil (trademark "KF-410"), carbinol-modified silicone oil (trademark "X-22-160AS"), ester-modified silicone oil (trademark "X-22-715") and alkyl-modified silicone oil (trademark "KF-412") manufactured by Shin-Etsu Chemical Co., Ltd.

The range of the added amount of organic silicon compound (c) of the present invention is preferably from 0.1 wt % or more to 10 wt % or less, more preferably from 0.3 wt % or more to 5 wt % or less, further preferably from 0.5 wt % or more to 3 wt % or less based on the total amount of photosensitive resin composition. If the added amount is 0.1 wt % or more, tacks on the surface of a photo-curing product of the photosensitive resin composition and the surface friction resistance can be kept at a low level, and further, ink bridging at the time of printing is inhibited. If the added amount is 10 wt % or less, a phenomenon of rejection of an ink at the time of printing is not observed, and satisfactory printed matters can be obtained. A cutting characteristic can considerably be improved, for example the wear of a bite blade used is extremely low and the life of the blade can be prolonged when the photosensitive resin composition is coated in a cylindrical form and then photo-cured, and the surface is shaped by cutting for removing subtle irregularities on the surface to obtain a smooth surface. Further, if the added amount is 10 wt % or less, patterns can be formed on the plate surface without reducing an engraving speed when a laser engravable printing substrate as a photo-curing product of the photosensitive resin composition is subjected to laser engraving.

The number average molecular weight of the organic silicon compound (c) of the present invention is preferably 100 or more and 100000 or less, more preferably 300 or more and 10000 or less, further preferably 500 or more and 5000 or less. If the number average molecular weight is 100 or more, the amount of extraction into an ink from the inside of the photo-curing product of the photosensitive resin composition or the amount of extraction into a solvent for use in washing the plate can be kept at a low level. If the number average molecular weight is 100000 or less, a characteristic of mixing with other components constituting the photosensitive resin composition is satisfactory. Particularly, compound that are liquid at 20° C. are preferable.

A method for measuring the number average molecular weight (Mn) of the organic silicon compound (c) will be described. The organic silicon compound (c) is dissolved in a solvent, and analyzed by gel permeation chromatography (GPC method), and the number average molecular weight (Mn) is calculated by conversion with respect to standard polystyrene of which the molecular weight is known. For a compound having a wide molecular weight distribution, the number average molecular weight is determined by this method. As a measure for the molecular weight distribution, a ratio of the number average molecular weight (Mn) to the weight average molecular weight (Mw) calculated concurrently with Mn, namely a polydispersity (Mw/Mn) is used. If the polydispersity is 1.1 or more, it is determined that molecular weight distribution is wide, and a number average molecular weight determined by the GPC method is employed. For a compound of which the polydispersity is less than 1.1, the molecular structure can be analyzed because the molecular weight distribution is extremely narrow, and a molecular weight calculated using nuclear magnetic resonance spectroscopy (NMR method) or mass spectrometry is employed as the number average molecular weight.

The refractive index of the organic silicon compound (c) for use in the present invention is preferably 1.400 or more and 1.590 or less, more preferably 1.430 or more and 1.490 or less as a value measured using an Abbe refractometer at 25° C. If the refractive index is within this range, the organic silicon compound can be mixed with other components constituting the photosensitive resin composition without causing extreme opacity to ensure photo-curability and further ensure mechanical properties of the photo-cured material. In the process of fabricating a laser engravable printing substrate, it is not necessary to form fine patterns unlike a photosensitive resin plate on which fine patterns are formed by exposure to light and development using photolithography. Fine patterns are formed in a laser engraving step. For the photosensitive resin, it is generally said that a uniform composition having reduced light scattering by turbidity and the like is preferable for formation of fine patterns, whereas for the laser engravable printing substrate, only a curing characteristic at a fixed plate thickness is important, and even a composition with which more or less turbidity is present to cause light scattering allows the substrate to be fabricated by curing. Therefore, there is a significant advantage that the degree of freedom of selection of compounds that can be used is extremely high when the laser engravable printing substrateis formed as a photosensitive resin composition as a raw material. If the refractive index of the organic silicon compound (c) for use in the present invention is very different from the refractive index of components other than the organic silicon compound (c) in the photosensitive resin composition, the printing substrate may become significantly opaque. Thus, an approximate difference between the refractive index of the organic silicon compound (c) in the photosensitive resin composition and the refractive index of other components is preferably ±0.1 or less, more preferably ±0.05 or less.

The organic silicon compound (c) of the present invention preferably has no polymerizable unsaturated group in a molecule. However, in applications in which a solvent ink is not deposited on the surface, for example the application of an embossing sheet or roll capable of laser engraving, compounds having polymerizable unsaturated groups described above can be used because compounds of which the number of polymerizable unsaturated groups in a molecule is small, specifically 2 or less, and of which the number average molecular weight is relatively high, specifically 1000 or more, rejects alcohol and the like, and shrinkage by photo-curing does not raise a serious problem.

The resin (a) of the present invention preferably has a polymerizable unsaturated group having a number average molecular weight of 1000 or more and 200000 or less. A more preferable range of the number average molecular weight of the resin (a) is from 2000 or more to 100000 or less, and a further preferable range is from 5000 or more to 50000 or less. If the number average molecular weight of the resin (a) is 1000 or more, a printing original plate that is subsequently fabricated by crosslinking the resin retains a strength, and a relief image fabricated from this original plate is strong and can endure repeated use when used as a printing plate or the like. If the number average molecular weight of the resin (a) is 200000 or less, a sheeted or cylindrical laser engraved printing original plate can be fabricated while preventing an excessive increase in viscosity at the time of molding the photosensitive resin composition. The number average molecular weight mentioned herein refers to a value measured using gel permeation chromatography and calibrated and converted with respect to polystyrene of which the molecular weight is known.

The "polymerizable unsaturated group" of the present invention is defined as a polymerizable unsaturated group involved in a radical or addition polymerization reaction as described in the section concerning the organic silicon compound (c). Especially preferable resins (a) may include polymers having 0.7 or more polymerizable unsaturated groups per molecule on average. If the number of polymerizable unsaturated groups is 0.7 or more per molecule on average, the printing original plate is excellent in mechanical strength, and a relief shape becomes hard to be collapsed at the time of laser engraving. Further, its durability is satisfactory, and repeated use is endured, which is preferable. If the mechanical strength of the printing original plate is considered, the number of polymerizable unsaturated groups of the resin (a) is preferably 0.7 or more, further preferably more than 1 per molecule. In the resin (a) of the present invention, the position of the polymerizable unsaturated group is preferably such that the polymerizable unsaturated group is bonded directly at the end of a polymer main chain or the end of a polymer side chain, or in the polymer main chain or side chain. The average number of polymerizable unsaturated groups contained in one molecule of the resin (a) can be determined by molecular weight analysis by nuclear magnetic resonance spectroscopy (NMR method).

As a method for producing the resin (a), for example, a polymerizable unsaturated group may be introduced directly at the end of the molecule. Suitable alternative methods may include a method in which a compound having a plurality of reactive groups such as hydroxyl groups, amino groups, epoxy groups, carboxyl groups, acid anhydride groups, ketone groups, hydrazine residual groups, isocyanate groups, isothiocyanate groups, cyclic carbonate groups and alkoxycarbonyl groups and having a molecular weight of several thousands is made to react with a binder having a plurality of groups capable of being bonded to reactive groups of the component (e.g. polyisocyanate when the reactive group is a hydroxyl group or an amino group), adjustment of the molecular weight and conversion into a bonding group at the end are performed, and a group reactive with the bonding group at the end is made to react with an organic compound having a polymerizable unsaturated group to introduce the polymerizable unsaturated group at the end.

The resin (a) used is preferably a resin that is easily liquefied or a resin that is easily decomposed. For the resin that is easily decomposed, styrene, α-methylstyrene, α-methoxystyrene, acryl esters, methacryl esters, ester compounds, ether compounds, nitro compounds, carbonate compounds, carbamoyl compounds, hemiacetal ester compounds, oxyethylene compounds, aliphatic cyclic compounds and the like are preferably contained in a molecular chain as a monomer unit that is easily decomposed. Particularly, polyethers such as polyethylene glycol, polypropylene glycol and polytetraethylene glycol, aliphatic polycarbonates, aliphatic carbamates, poly methyl methacrylate, polystyrene, nitrocellulose, polyoxyethylene, polynorbornen, hydrogenated polycyclohexadienes, or polymers having a molecular structure such as a dendrimer having a large number of branched structures are typical examples of resins that are easily decomposed. Polymers containing a large number of oxygen atoms in a molecular chain are preferable in terms of decomposability. Among them, compounds having a carbonate group, a carbamate group and a methacryl group in a polymer main chain have a high heat decomposability and are preferable. For example, examples of polymers having a satisfactory heat decomposability may include polyesters and polyurethanes synthesized using (poly)carbonatediol and (poly)carbonate dicarboxylic acid as a raw material, and polyamides synthesized using (poly)carbonate diamine as a raw material. These polymers may contain a polymerizable unsaturated group in a main chain or a side chain. Particularly, if having a reactive functional group such as a hydroxyl group, an amino group or a carboxyl group at the end, it is easy to introduce a polymerizable unsaturated group at the end of the main chain.

Examples of the resin (a) may include compounds having a polymerizable unsaturated group in a main chain or a side chain of the molecule of polydienes such as polybutadiene and polyisoprene. Examples of the resin (a) may also include polymer compounds having a polymerizable unsaturated group introduced in the molecule by a chemical reaction such as a substitution reaction, an elimination reaction, a condensation reaction or an addition reaction using as a starting raw material a polymer compound having no polymerizable unsaturated group. Examples of polymer compounds having no polymerizable unsaturated group may include C—C chain polymers such as polyolefins such as polyethylene and polypropylene, polyhaloolefins such as polyvinyl chloride and polyvinylidene chloride, polystyrene, polyacrylonitrile, polyvinyl alcohol, polyvinyl acetate, polyvinyl acetal, polyacrylic acid, poly(metha)acrylates, poly(metha)acrylamide and polyvinyl ether, as well as polymer compounds such as polyethers such as polyphenyl ether, polythioethers such as polyphenylene thioether, polyesters such as polyethylene terephthalate, polycarbonate, polyacetal, polyurethane, polyamide, polyurea, polyimide and polydialkyl siloxane or polymer compounds having a hetero atom on the main chain of these polymer compounds, and random copolymers and block copolymers synthesized from a plurality of types of monomer components. Further, a plurality of types of polymer compounds having a polymerizable unsaturated group in a molecule may be mixed and used.

Particularly, if a flexible relief image is required as in the application of flexographic printing plates, it is especially preferable that preferably a liquid resin having a glass transition temperature of 20° C. or less, further preferably a liquid resin having a glass transition temperature of 0° C. or less is used in part. As such liquid resins, for example, compounds synthesized using hydrocarbons such as polyethylene, polybutadiene, hydrogenated polybutadiene, polyisoprene and hydrogenated polyisoprene, polyesters such as adipate and polycaprolactone, polyethers such as polyethylene glycol, polypropylene glycol and polytetramethylene glycol, silicones such as aliphatic polycarbonate and polydimethylsiloxane, polymers of (metha)acrylic acid and/or derivatives thereof, and mixtures and copolymers thereof, and having a polymerizable unsaturated group in a molecule may be used. The content of the liquid resin is preferably 30 wt % or more based on the total amount of resin (a). Particularly, unsaturated polyurethanes having a polycarbonate structure are preferable in terms of the weather resistance.

The term "liquid resin" mentioned herein refers to a polymer having a property of being easily fluidized and deformed and being capable of being solidified into the deformed shape by cooling, and corresponds to an elastomer having a property of being instantly deformed in response to an external force when applying the external force and recovering an original shape in a short time when removing the external force.

When the resin (a) is a liquid resin at 20° C., the photosensitive resin composition is also liquid at 20° C. When an original plate for formation of a relief image obtained from this composition is molded into a sheeted form or a cylindrical form, satisfactory thickness accuracy and dimensional accuracy can be obtained. The viscosity of the photosensitive resin composition of the present invention at 20° C. is preferably 10 Pa·s or more and 10 kPa·s or less, further preferably 50 Pa·s or more and 5 kPa·s or less. If the viscosity is 10 Pa·s or more, the printing substrate fabricated has a sufficient mechanical strength, easily retains a shape even when molded into a cylindrical printing substrate, and is easily processed. If the viscosity is 10 kPa·s or less, the printing substrate is easily deformed even at normal temperature, easily processed and easily molded into a sheeted or cylindrical printing substrate, and the process is simple. Particularly, for obtaining a cylindrical printing substrate having high plate thickness accuracy, the viscosity of the photosensitive resin composition is preferably 100 Pa·s or more, more preferably 200 Pa·s or more, further preferably 500 Pa·s or more so as not to cause a phenomenon such as liquid dripping by gravity when a liquid photosensitive resin layer is formed on a cylindrical support. Particularly when the photosensitive resin composition for use in the present invention is liquid at 20° C., it preferably has a thixotropic characteristic. This is because a predetermined thickness can be retained without causing liquid dripping by gravity particularly when a photosensitive resin composition layer is formed on the cylindrical support.

The organic compound (b) of the present invention is a compound having a polymerizable unsaturated group of which the number average molecular weight is less than 1000. The number average molecular weight is preferably less than 1000 in terms of ease of dilution with the resin (a). The polymerizable unsaturated group is defined as a polymerizable unsaturated group involved in a radical or addition polymerization reaction as described in the sections concerning the organic silicon compound (c) and the resin (a).

Specific examples of the organic compound (b) include olefins such as ethylene, propylene, styrene and divinyl benzene, acetylenes, (metha)acrylic acid and derivatives thereof, haloolefins, unsaturated nitrites such as acrylonitrile, (metha)acrylamide and derivatives thereof, aryl compounds such as aryl alcohol and aryl isocyanate, unsaturated dicarbonic acids such as maleic anhydride, maleic acid and fumaric acid and derivatives thereof, vinyl acetates, N-vinyl pyrolidone and N-vinyl carbazole. (Metha)acrylic acid and derivatives thereof are preferable examples in terms of the abundance in type, the cost, the decomposability during application of laser light, and the like. The derivatives include alicyclic compounds having a cycloalkyl group, a bicycloalkyl group, a cycloalkene group, a bicycloalkene group and the like, aromatic compounds having a benzyl group, a phenyl group, a phenoxy group, a fluorene group and the like, compounds having an alkyl group, a halogenated alkyl group, an alkoxyalkyl group, a hydroxyalkyl group, an aminoalkyl group, a glycidyl group and the like, and ester compounds with polyvalent alcohols such as alkylene glycol, polyoxyalkylene glycol, polyalkylene glycol and trimethylol propane.

Compounds having an epoxy group undergoing an addition polymerization reaction as the organic compound (b) may include compounds obtained by making epichlorohydrine react with various kinds of polyols such as diol and triol, and epoxy compounds obtained by making a peracid react with an ethylene bond in a molecule. Specific examples of the compounds may include epoxy compounds such as ethylene glycol diglycidyl ether, diethylene glycol diglycidyl ether, triethylene glycol diglycidyl ether, tetraethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerin diglycidyl ether, glycerin triglycidyl ether, trimethylol propane triglycidyl ether, bisphenol A diglycidyl ether, hydrogenated bisphenol A diglycidyl ether, diglycidyl ether of compounds with ethylene oxide or propylene oxide added to bisphenol A, polytetramethylene glycol diglycidyl ether, poly(propylene glycol adipate)diol diglycidyl ether, poly(ethylene glycol adipate)diol diglycidyl ether and poly(caprolactone)diol diglycidyl ether.

In the present invention, one or more organic compounds (b) having these polymerizable unsaturated bonds may be selected according to the purpose thereof. For example, if the compound is used for a printing plate, at least one long-chain aliphatic, alicyclic or aromatic derivative is preferably included as the organic compound which is used for suppressing swelling by an organic solvent such as an alcohol or an ester that is a solvent for a printing ink.

For improving the mechanical strength of printing original plate obtained from the resin composition of the present invention, at least one alicyclic or aromatic derivative is preferably included as the organic compound (b). In this case, the amount of the derivative is preferably 20 wt % or more, further preferably 50 wt % or more based on the total amount of organic compound (b). The above described aromatic derivative may be an aromatic compound having elements such as nitrogen and sulfur.

For improving the rebound resilience of the printing plate, a methacryl monomer described in, for example, JP-A-7-239548 may be used, or a selection may be made using technical information of publicly known photosensitive resins for printing, and so forth.

In the application where the solvent resistance is required, the resin (a) and/or the organic compound (b) of the present invention is preferably a compound having in a molecular chain at least one bond selected from the group consisting of carbonate bonds, ester bonds and ether bonds, and/or having at least one molecular chain selected from the group consisting of aliphatic saturated hydrocarbon chains and aliphatic unsaturated hydrocarbon chains and having an urethane bond. Among them, compounds having carbonate bonds or compounds having aliphatic hydrocarbon chains show an especially high solvent resistance to ester solvents that are often used in solvent inks.

The photosensitive resin composition of the present invention is crosslinked by application of light or an electron beam to realize properties as a printing plate or the like, and at this time, a polymerization initiator may be added. The polymerization initiator may be selected from those that are generally used, and for example, initiators for radical polymerization, cationic polymerization and anionic polymerization illustrated in "Polymer Data Handbook—Basic Part" edited by The Society of Polymer Science, Japan; published by BAIFUKAN CO., LTD., 1986, may be used. Crosslinking the resin composition by photopolymerization using a photopolymerization initiator is useful as a method allowing printing original plates to be produced with good productivity while maintaining the storage stability of the resin composition of the present invention, and a publicly known initiator may be used as an initiator that is used in this case. For the photopolymerization initiator inducing a radical polymerization reaction, a hydrogen extraction photopolymerization initiator (d) and a degradable photopolymerization initiator (e) are widely used as especially effective photopolymerization initiators.

The hydrogen extraction polymerization initiator (d) is not specifically limited, but aromatic ketone is preferably used. Aromatic ketone goes into an excitation triplet state efficiently by optical excitation, and for this excitation triplet state, a chemical reaction mechanism in which hydrogen is extracted from surrounding media to generate radicals has been proposed. It is conceivable that the generated radicals are involved in a photo-crosslinking reaction. The hydrogen extraction photopolymerization initiator (d) for use in the present invention may be any compound as long as it extracts hydrogen from surrounding media to generate radicals via the excitation triplet state. Aromatic ketones may include benzophenones, Michler's ketones, xanthenes, thioxanthones and anthraquinones, and at least one compound selected from the group consisting of these compounds is preferably used. Benzophenones refer to benzophenone and derivatives thereof, specific examples of which include 3,3',4,4'-benzophenonetetracarboxylic anhydride and 3,3',4,4'-tetramethoxybenzophenone. Michler's ketones refer to Michler's ketone and derivatives thereof. Xanthenes refer to xanthene and derivatives substituted with an alkyl group, a phenyl group and a halogen group. Thioxanthones refer to thioxanthone and derivatives substituted with an alkyl group, a phenyl group and a halogen group, which may include ethylthioxanthone, methylthioxanthone and chlorothioxanthone. Anthraquinones refer to anthraquinone and derivatives substituted with an alkyl group, a phenyl group, a halogen group and the like. The added amount of hydrogen extraction photopolymerization initiator is preferably 0.1 wt % or more and 10 wt % or less, more preferably 0.5 wt % or more and 5 wt % or less of the total amount of photosensitive resin composition. If the added amount is within this range, the curability of the surface of the cured material can sufficiently be ensured and the weather resistance can be ensured when a liquid photosensitive resin composition is photo-cured in air.

The degradable photopolymerization initiator (e) refers to a compound in which after absorption of light, a cleavage reaction occurs in a molecule and active radicals are generated, and is not specifically limited. Specific examples thereof may include benzoinalkyl ethers, 2,2-dialkoxy-2-phenylacetophenones, acetophenones, acyloxime esters, azo compounds, organic sulfur compounds and diketones, and at least one compound selected from the group consisting of these compounds is preferably used. Benzoinalkyl ethers may include benzoinisopropyl ether, benzoinisobutyl ether, compounds described in "Photosensitive Polymers" (Kodansha Co., Ltd., published in 1977, p. 228). 2,2-dialkoxy-2-phenylacetophenones may include 2,2-dimethoxy-2-phenylacetophenone and 2,2-diethoxy-2-phenylacetophenone. Acetophenones may include acetophenone, trichloro acetophenone, 1-hydroxycyclohexylphenylacetophenone and 2,2-diethoxy acetophenone. Acyloxime esters may include 1-phenyl-1,2-propanedione-2-(o-benzoyl)oxime. Azo compounds may include azobis isobutyronitorile, diazonium compounds and tetrazene compounds. Organic sulfur compounds may include aromatic thiol, mono and disulfide, thiuram sulfide, dithiocarbamate, S-acyl dithiocarbamate, thiosulfonate, sulfoxide, sulphenate and dithiocarbonate. Diketones may include benzyl and methyl benzoyl formate. The added amount of degradable photopolymerization initiator is preferably 0.1 wt % or more and 10 wt % or less, more preferably 0.3 wt % or more and 3 wt % or less of the total amount of the photosensitive resin composition. If the added amount is within this range, the curability of the inside of the cured material can sufficiently be ensured when the photosensitive resin composition is photo-cured in air.

A compound having in the same molecule a site functioning as the hydrogen extraction photopolymerization initiator and a site functioning as the degradable photopolymerization initiator may also be used as a photopolymerization initiator. Examples thereof may include α-aminoacetophenones. They may include, for example, 2-methyl-1-(4-methylthiophenyl)-2-morpholino-propane-1-one and compounds expressed by the general formula (6).

[Formula 5]

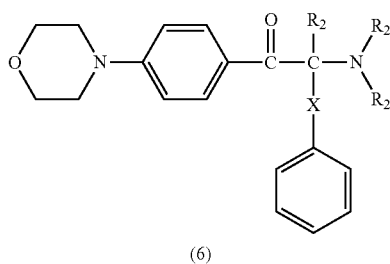

(6)

(In the formula, $R_2$ each independently represents a hydrogen atom or an alkyl group having 1 to 10 carbon atoms, and X represents an alkylene group having 1 to 10 carbon atoms.)

The added amount of the compound having in the same molecule a site functioning as the hydrogen extraction photopolymerization initiator and a site functioning as the degradable photopolymerization initiator is preferably 0.1 wt % or more and 10 wt % or less, more preferably 0.3 wt % or more and 3 wt % or less of the total amount of the photosensitive resin composition. If the added amount is within this range, the mechanical properties of the cured material can sufficiently be ensured even when the photosensitive resin composition is photo-cured in air.

A photopolymerization initiator inducing an addition polymerization reaction by absorbing light and generating an acid may also be used. Examples of the photopolymerization initiator include photo-cationic polymerization initiators such as aromatic diazonium salts, aromatic iodonium salts and aromatic sulfonium salts, or polymerization initiators absorbing light and generating a base. The added amount of the photopolymerization initiator is preferably in a range from 0.1 wt % or more to 10 wt % or less of the total amount of photosensitive resin composition.

An inorganic porous material (f) is preferably added to the photosensitive resin composition of the present invention. The inorganic porous material (f) is inorganic particles having very small pores or very small air gaps in particles, and an additive for absorbing away sticky liquid debris generated in a large amount in laser engraving, and also has an effect of preventing tacks on the plate surface. The inorganic porous material of the present invention is added principally for the purpose of removing sticky liquid debris, and its performance is significantly influenced by the number average particle diameter, the specific surface area, the average pore diameter, the pore volume and the ignition loss.

The inorganic porous material (f) of the present invention preferably has a number average particle diameter of 0.1 to 100 μm. If an inorganic porous material having a number average particle diameter below this range is used, powder dust flies to contaminate a sculpture apparatus when an original plate obtained from the resin composition of the present invention is sculptured with a laser, and in addition, problems such as a rise in viscosity, entanglement of air bubbles and generation of powder dust may occur when the inorganic porous material is mixed with the resin (a) and the organic compound (b). If an inorganic porous material having a number average particle diameter above the aforementioned range is used, defects tend to occur in relief images at the time of laser engraving, and the fineness of printed matters tends to be impaired. A more preferable range of the average particle diameter is from 0.5 to 20 μm, and a further preferable range is from 3 to 10 μm. The average particle diameter of a porous inorganic absorbent of the present invention is a value measured using a laser scattering particle diameter distribution measuring apparatus.

The range of the specific surface area of the inorganic porous material (f) of the present invention is preferably from 10 m²/g or more to 1500 m²/g or less, more preferably from 100 m²/g or more to 800 m²/g or less. If the specific surface area is 10 m²/g or more, removal of liquid debris at the time of laser engraving is sufficient, and if the specific surface area is 1500 m²/g or less, a rise in viscosity of the photosensitive resin composition can be inhibited, and a thixotropic characteristic can be inhibited. The specific surface area in the present invention is determined based on the BET equation from an absorption isotherm of nitrogen at −196° C.

The average pore diameter of the inorganic porous material (f) of the present invention very greatly influences the absorption of liquid debris generated at the time of laser engraving. The average pore diameter is preferably 1 nm or more and 1000 nm or less, more preferably 2 nm or more and 200 nm or less, further preferably 2 nm or more and 50 nm or less. If the average pore diameter is 1 nm or more, the absorption of liquid debris generated at the time of laser engraving can be ensured, and if the average pore diameter is 1000 nm or less, the specific surface areas of particles are so large that the absorption of liquid debris can sufficiently be ensured. The reason why the absorption of liquid debris is low if the average pore diameter is less than 1 nm has not been clarified, but it can be assumed that liquid debris is sticky and therefore hard to enter a micropore, and thus the absorption is low.

In the present invention, the average pore diameter is a value measured using a nitrogen absorption method. Pores having an average pore diameter of 2 to 50 nm are particularly called mesopores, and porous particles having mesopores have an extremely high capability of absorbing liquid debris. The pore diameter distribution in the present invention is determined from an absorption isotherm of nitrogen at −196° C.

The pore volume of the inorganic porous material (f) of the present invention is preferably 0.1 ml/g or more and 10 ml/g or less, more preferably 0.2 ml/g or more and 5 ml/g or less. If the pore volume is 0.1 ml/g or more, the absorption of sticky liquid debris is sufficient, and if the pore volume is 10 ml/g or less, the mechanical strength of particles can be ensured. In the present invention, the nitrogen absorption method is used for measurement of the pore volume. The pore volume of the present invention is determined from the absorption isotherm of nitrogen at −196° C.

In the present invention, there is an oil absorption as an index for evaluation of the adsorption of liquid debris. The oil absorption is defined by the amount of oil absorbed by 100 g of inorganic porous material. A preferable range of the oil absorption of the inorganic porous material for use in the present invention is from 10 ml/100 g or more to 2000 ml/100 g or less, and a more preferable range is from 50 ml/100 g or more to 1000 ml/100 g or less. If the oil absorption is 10 ml/100 g or more, removal of liquid debris generated at the time of laser engraving is sufficient, and if the oil absorption is 2000 ml/100 g or less, the mechanical strength of the inorganic porous material can sufficiently be ensured. The measurement of the oil absorption was carried out in accordance with JIS-K5101.

The inorganic porous material (f) of the present invention preferably retains porosity without being deformed or melted by application of laser light in an infrared wavelength range. The ignition loss when treating the inorganic porous material (f) at 950° C. for 2 hours is preferably 15 wt % or less, more preferably 10 wt % or less.

The shape of particles of the inorganic porous material of the present invention is not specifically limited, and spherical particles, flat particles, acicular particles, amorphous particles, particles having projections on the surfaces, or the like may be used. Spherical particles are especially preferable particularly in terms of the abrasion resistance. Hollowed particles, spherical granules having uniform pore diameters, such as a silica sponge, and the like can also be used. Examples thereof may include, but are not specifically limited to, porous silica, mesoporous silica, silica-zirconia porous gel, porous alumina and porous glass. For materials having air gaps of several nm to 100 nm between layers, such as layered clay compounds, the pore diameter cannot be defined, and therefore the distance between air gaps existing between layers is defined as a pore diameter.

Further, an organic coloring matter such as a pigment or a dye absorbing light having a wavelength of laser light can be captured in these pores or air gaps.

The sphericity is defined as an index for specifying spherical particles. The sphericity for use in the present invention is defined by a ratio of a maximum value $D_1$ of a circle fully encompassed within a projected view to a minimum value $D_2$ of a circle fully encompassing the projected view ($D_1/D_2$) when particles are projected. In the case of a sphere, the sphericity is 1.0. The sphericity of spherical particles for use in the present invention is preferably 0.5 or more and 1.0 or less, more preferably 0.7 or more and 1.0 or less. If the sphericity is 0.5 or more, the abrasion resistance as a printing plate is satisfactory. The sphericity of 1.0 is an upper limit of the sphericity. As spherical particles, preferably 70% or more, more preferably 90% or more of particles desirably have a sphericity of 0.5 or more. As a method for measuring the sphericity, a method in which the sphericity is measured based on a photograph taken using a scanning electron microscope may be used. At this time, a photograph is taken under a magnification allowing at least 100 particles to be encompassed with in a monitor screen. The above described $D_1$ and $D_2$ are measured based on a photograph, but preferably, the photograph is processed using an apparatus such as a scanner for digitizing the photograph, and data is then processed using image analysis software.

The surface of the inorganic porous material may be coated with a silane coupling agent, titanium coupling agent or other organic compound to perform a surface modification treatment to use more hydrophilic or hydrophobic particles.

In the present invention, one or more the inorganic porous material (f) may be selected, and by adding the inorganic porous material (f), improvements such as inhibition of generation of liquid debris at the time of laser engraving and prevention of tacks on the relief printing plate are performed effectively.

In the photosensitive resin composition of the present invention, the amount of organic compound (b) is preferably in a range from 5 to 200 parts by weight, more preferably in a range from 20 to 100 parts by weight based on 100 parts by weight of resin (a). The amount of inorganic porous material (c) is preferably in a range from 1 to 100 parts by weight, more preferably in a range from 2 to 50 parts by weight, further preferably in a range from 2 to 20 parts by weight.

If the ratio of the organic compound (b) is below the aforementioned range, problems of difficulty in balancing the hardness and the tensile strength and elongation of the obtained printing plate and the like tend to occur, and if the ratio of the organic compound (b) is above the aforementioned range, shrinkage at the time of crosslinking and curing tends to be so large that the thickness accuracy is impaired.

If the amount of inorganic porous material (f) is below the aforementioned range, there may be cases where effects of inhibiting generation of sculpture liquid debris, and so on are not sufficiently exhibited when laser engraving is performed depending on the type of resin (a) and organic compound (b), and if the amount of inorganic porous material (f) is above the aforementioned range, the printing plate tends to become fragile. Furthermore, the transparency may be impaired, and the hardness may become too high particularly when the printing plate is used as a flexographic plate. When the photosensitive resin composition is cured using light, particularly ultraviolet light, to fabricate a laser engravable printing substrate, the light transmittance influences the curing reaction. Thus, an inorganic porous material having a refractive index close to the refractive index of the photosensitive resin composition is preferably used.

The method for mixing the inorganic porous material in the photosensitive resin composition may be either a method in which a thermoplastic resin is heated to be fluidized and the inorganic porous material (f) is added directly to the resin or a method in which the thermoplastic resin and the photopolymerizable organic compound (b) are first mixed, and to the resultant mixture is added the inorganic porous material (f).

In addition, to the resin composition of the present invention may be added a polymerization inhibitor, an ultraviolet absorbing agent, a dye, a pigment, a lubricant, a surfactant, a plasticizer, a flavor and the like according to the application and purpose.

The laser engravable printing substrate of the present invention is formed by photo-crosslinking and curing the photosensitive resin composition containing the organic silicon compound (c). Thus, a three-dimensionally crosslinked structure is formed by a reaction between polymerizable unsaturated groups of the organic compound (b) or a reaction between the polymerizable unsaturated group of the resin (a) and the polymerizable unsaturated group of the organic compound (b), and the photosensitive resin composition becomes insoluble in ester, ketone, aromatic, ether, alcohol and halogen solvents which are usually used. This reaction occurs between organic compounds (b), between resins (a) or between the resin (a) and the organic compound (b), and the polymerizable unsaturated group is consumed. When the photosensitive material is crosslinked and cured using a photopolymerization initiator, the photopolymerization initiator is decomposed by light, and therefore an unreacted photopolymerization initiator and a decomposition product can be identified by extracting the crosslinked and cured material with a solvent and performing analysis using the GC-MS method (method of performing mass analysis of a substance separated by gas chromatography), the LC-MS method (method of performing mass analysis of a substance separated by liquid chromatography), the GPC-MS method (separating a substance by gel permeation chromatography and performing mass analysis of the substance) or the LC-NMR method (separating a substance by a liquid chromatography and performing analysis of the substance by a nuclear magnetic resonance spectrum). Further, by using the GPC-MS method, the LC-MS method or the GPC-NMR method, an unreacted polymer, an unreacted organic compound (b) and a relatively low molecular weight product obtained by a reaction of a polymerizable unsaturated group in a solvent extracted material can be identified from analysis of the solvent extracted material. For solvent-insoluble high molecular weight components forming the three-dimensionally crosslinked structure, whether a site generated by the reaction of the polymerizable unsaturated group is present as a component forming the high molecular weight material can be verified by using the pyrolysis GC-MS method. For example, the presence of a site by the reaction of a polymerizable unsaturated group such as a methacrylate group, an acrylate group or a vinyl group can be predicted from a mass analysis spectrum pattern. The pyrolysis GC-MS method is a method in which a sample is decomposed by heating, generated gas components are separated by gas chromatography, and mass analysis is then performed. If a decomposition product originating from the photopolymerization reaction or an unreacted photopolymerization initiator is detected together with an unreacted polymerizable unsaturated group or a site obtained by the reaction of the polymerizable unsaturated group in the crosslinked and cured material, it can be concluded that this material has been obtained by photo-crosslinking and curing the photosensitive resin composition.

Identification of the organic silicon compound (c) existing in the photosensitive resin composition or the photo-crosslinked and cured material can be performed by making use of various kinds of analysis methods described above.

The amount of inorganic porous material fine particles present in the crosslinked and cured material can be determined by heating the crosslinked and cured material in air to burn off organic components and measuring the weight of residues. The presence of inorganic porous material fine particles in the above described residues can be identified from observation of the morphology by an electric field emission high-resolution scanning electron microscope, and measurements of a particle diameter distribution by a laser scattering particle diameter distribution measuring apparatus and a pore volume, a pore diameter distribution and a specific surface area by a nitrogen adsorption method.

The laser engravable printing substrate of the present invention contains an organic silicon compound in the printing substrate and/or on the surface of the printing substrate. The organic silicon compound contained can be identified by the solid nuclear magnetic resonance spectrometry (solid $^{29}$SiNMR) method in which the observed nucleus is Si having an atomic weight of 29. In this method, the organic silicon compound and the inorganic silicon compound can be separated from a chemical shift of an observed peak originating from Si. Further, what functional group is attached to the Si atom can be determined from the value of the chemical shift. The organic silicon compound of the present invention is a compound having a peak at −90 ppm or higher (low magnetic field side) in the solid $^{29}$SiNMR chart. The inorganic silicon compound in the present invention has a peak on a high magnetic field side from −90 ppm in the solid $^{29}$SiNMR chart. In the case of a system in which the organic silicon compound and the inorganic silicon compound coexist, an abundance ratio between silicon originating from the organic silicon compound and silicon originating from the inorganic silicon compound can be determined from the integral value of the observed peak.

The abundance ratio of silicon atoms originating from the organic silicon compound contained in the laser engravable printing substrate of the present invention is preferably 0.01 wt % or more and 10 wt % or less. If the abundance ratio is within this range, removal of sticky debris generated in surface processing such as cutting, grinding and polishing is easy, and inhibition of ink stains, improvement of the abrasion resistance and inhibition of tacks on the surface for the printing substrate are effectively performed. The abundance ratio of silicon atoms originating from the organic silicon compound can be determined quantitatively using plasma emission spectrometry focusing on silicon atoms and the above described solid $^{29}$SiNMR method. In the case of the system in which the organic silicon compound and the inorganic silicon compound coexist, the ratio of silicon existing in the system can be determined by plasma emission spectrometry. However, in this method, silicon originating from the organic silicon compound and silicon originating from the inorganic silicon compound cannot separated, and therefore by using the above described solid $^{29}$SiNMR method in combination, silicon originating from the organic silicon compound can be separated and determined quantitatively. Thus, the abundance ratio of silicon atoms originating from the organic silicon compound of the present invention is defined as $W_{Si} \times (I_{org}/(I_{org}+I_{ino}))$, where the ratio of weight of silicon atoms to the total weight of a sample quantified using plasma emission spectrometry is $W_{Si}$, the integral value of the peak originating from the organic silicon compound obtained in the solid $^{29}$SiNMR method is $I_{org}$, and the integral value of the peak originating from the inorganic silicon compound is $I_{ino}$. Here, the unit of $W_{Si}$ is wt %. Plasma emission spectrometry for use in the present invention is a useful method capable of quantitative determination of elements of extremely low concentrations. The sample for evaluation may be either a slice having a cross section obtained by cutting the cured photosensitive resin in a direction of depth or a sample obtained by cutting out an area near the surface layer.

Another method capable of detecting the organic silicon compound in the laser engravable printing substrate may be a pyrolysis GC/MS method. Particularly, if the organic silicon compound contained is a silicone compound, a cyclic silicone compound is produced when the cured photosensitive resin constituting the laser engravable printing substrate is decomposed by heat, and therefore the cyclic silicone compound can be separated and identified by using the GC/MS method.

For the method for molding the resin composition of the present invention into a sheet or a cylinder, an existing method for molding resins may be used. Examples of the method may include a cast molding method, and a method in which a resin is extruded from nozzles or dies by a machine such as a pump or an extruder, and calendered by a roll for making the thickness uniform by a blade to make the thickness uniform. In this case, it is also possible to carry out molding while heating the resin within the bounds not degrading the performance of the resin. The resin may also be subjected to rolling, grinding and the like as necessary. Normally, the resin compound is often molded on an underlay called a back film composed of a material such as PET or nickel, but there may be cases where the resin composition is molded directly on a cylinder of a printer. A cylindrical support made of a fiber reinforcement plastic (FRP), a plastic or a metal may also be used. A cylindrical support having a fixed thickness and hollowed may be used for reduction of the weight. The role of the back film or the cylindrical support is to ensure the dimensional stability of the printing substrate. As a material thereof, a material having high dimensional stability should be selected. When an evaluation is made using a linear expansion coefficient, the upper limit for the material is 100 ppm/° C. or less, further preferably 70 ppm/° C. or less. Specific examples of the material may include polyester resins, polyimide resins, polyamide resins, polyamide imide resins, polyether imide resins, polybismaleimide resins, polysulfone resins, polycarbonate resins, polyphenylene ether resins, polyphenylene thioether resins, polyether sulfone resins, liquid crystal resins composed of fully aromatic polyester resins, fully aromatic polyamide resins and epoxy resins. Furthermore, these resins may be laminated and used. For example, a sheet in which layers of polyethylene terephthalate having a thickness of 50 μm are laminated on opposite surfaces of a fully aromatic polyamide film having a thickness of 4.5 μm, or the like may be used. A porous sheet, for example a cross formed by knitting fibers, a nonwoven fabric, or a film provided with pores may be used as a back film. If a porous sheet is used as a back film, the cured photosensitive resin layer and the back film are united so that high adhesion can be obtained, by impregnating pores with the photosensitive resin composition, followed by photo-curing. Fibers forming the cross or the nonwoven fabric may include inorganic fibers such as glass fibers, alumina fibers, carbon fibers, alumina/silica fibers, boron fibers, high silicon fibers, potassium titanate fibers and sapphire fibers, natural fibers such as cotton and hemp, semisynthetic fibers such as rayon and acetate, and synthetic fibers such as nylon, polyester, acryl, vinylon, polyvinyl chloride, polyolefin, polyurethane, polyimide and aramid. Cellulose produced by bacteria is highly crystalline nanofibers, and is a material allowing fabrication of a nonwoven fabric which is thin and has high dimensional stability.

Methods for reducing the linear expansion coefficient of the back film may include a method in which a filler is added, and a method in which a meshed cloth of fully aromatic polyamide or the like, a glass cloth, or the like is impregnated or coated with a resin. For the filler, organic fine particles that are usually used, inorganic fine particles such as metal oxides or metals, organic/inorganic composite fine particles and the like may be used. Porous fine particles, hollowed fine particles, microcapsule particles, and layered compound particles with a low-molecular compound intercalated therein may also be used. Particularly, fine particles of metal oxides such as alumina, silica, titanium oxide and zeolite, latex fine particles composed of a polystyrene/polybutadiene copolymer, organic fine particles of natural products such as highly crystalline celluloses, and the like are useful.

By physically and chemically treating the surface of the back film or cylindrical support for use in the present invention, the adhesion with the photosensitive resin composition layer or adhesive layer can be improved. Physical treatment methods may include a sand blast method, a wet blast method of jetting a liquid containing fine particles, a corona discharge treatment method, a plasma treatment method, and ultraviolet ray or vacuum ultraviolet ray irradiation method. Chemical treatment methods include a strong acid/strong alkali treatment method, an oxidant treatment method and a coupling agent treatment method.

The molded photosensitive resin composition layer is crosslinked by application of light to form a printing substrate. The photosensitive resin composition layer may also be crosslinked by application of light while it is molded. Light sources that are used for curing may include a high pressure mercury lamp, a super-high pressure mercury lamp, an ultraviolet fluorescent lamp, a bacteriocidal lamp, a carbon arc lamp, a xenon lamp and a metal halide lamp. Light applied to the photosensitive resin composition layer preferably has a wavelength of 200 nm to 300 nm. Particularly, the hydrogen extraction photopolymerization initiator often has a strong optical absorption in this wavelength range, and therefore if light having a wavelength of 200 nm to 300 nm is used, the curability of the surface of the cured photosensitive resin layer can sufficiently be ensured. One light source may be used for curing, but since the curability of the resin is improved in some cases by curing the resin using two or more types of light source of different wavelengths, two or more types of light sources may be used.

The thickness of the printing substrate for use in laser engraving may arbitrarily be set according to the purpose of use, but is preferably 0.1 to 7 mm when the printing substrate is used as a printing plate. In some cases, a plurality of materials having different compositions may be laminated. For example, a layer capable of being subjected sculpture using a laser having an oscillation wavelength in a near infrared range, such as a YAG laser, a fiber laser or a semiconductor laser, can be formed on the outermost surface, and under the layer, a laser capable of being subjected to laser engraving using an infrared laser such as a carbon dioxide gas laser or a visible/ultraviolet laser can be formed. By forming such a laminated structure, relatively rough patterns can be sculpted deeply using a carbon dioxide gas laser of extremely high output, and extremely fine patterns near the surface can be sculpted using a near infrared laser such as a YAG laser or a fiber laser. Since extremely fine patterns may be sculpted to a relatively shallow depth, the thickness of a layer sensitive to the near infrared laser is preferably in a range from 0.01 mm or more to 0.5 mm or less. Thus, by laminating a laser sensitive to a near infrared laser and a layer sensitive to an infrared laser, the depth of patterns sculpted using the near infrared laser can accurately be controlled. This is because a phenomenon of difficulty in sculpting a layer sensitive to an infrared laser using a near infrared laser is utilized. A difference in fineness of patterns capable of sculpture results from a difference in the oscillation wavelength specific to a laser apparatus, namely a difference in the laser beam diameter which can be reduced. When laser engraving is performed by such a method, sculpture may be performed using different laser engraving apparatuses having an infrared laser and a near infrared laser, respectively, or sculpture may be performed using a laser engraving apparatus having both of an infrared laser and a near infrared laser.

The wettability of the surface of the laser engravable printing substrate of the present invention is an extremely important factor in acceptance and transfer of an ink. When 20 μl of indicating liquid of surface energy of 30 mN/m collected using quantitative and fixed type micropipette is added dropwise onto the surface of the laser engravable printing substrate and the maximum diameter of an area where the above described droplet spreads is measured after 30 seconds, in evaluation of the surface wettability carried out under a temperature condition of 25° C., the diameter of the droplet is preferably 4 mm or more and 20 mm or less, more preferably 5 mm or more and 15 mm or less. The indicating liquid often concentrically spreads, but does not necessarily concentrically spread depending on the state of the surface of the printing substrate. In this case, the minimum value of the diameter of a circle fully encompassing the spread area is defined as a maximum diameter of the area where the indicating liquid droplet spreads. If the maximum diameter of the area where the droplet spreads is in a range from 4 mm or more to 20 mm or less, there is no possibility that an ink is rejected to make a printed matter uneven, and an effect of inhibiting the remaining of the ink on the plate surface is exhibited.

In the present invention, a cushion layer composed of an elastomer can also be formed under a laser engravable layer. The thickness of a layer subjected to laser engraving is generally 0.1 to several mm, and therefore other underlying layers may be made of materials having different compositions. The cushion layer is preferably an elastomer layer having a Shore A hardness of 20 to 70 degrees or an ASKER-C hardness of 10 degrees and more and 60 degrees or less. If the Shore A hardness is 20 degrees or more or the ASKER-C hardness is 10 degrees or more, printing quality can be ensured because the layer is appropriately deformed. If the shore A hardness is 70 degrees or less or the ASKER-C hardness is 60 degrees or less, the layer can play a role as a cushion layer. A more preferable range of the Shore A hardness is from 30 to 60 degrees, and a more preferable range of the ASKER-C hardness is from 20 to 50 degrees. For the shore A hardness or the ASKER-C hardness of the present invention, a value measured with the thickness of a cushion layer used is employed.

The above described cushion layer is not specifically limited, but may be made of any material having rubber elasticity, such as a thermoplastic elastomer, a photo-curable elastomer or a heat-curable elastomer. The cushion layer may be a porous elastomer layer having micropores of a nanometer order. It is convenient and hence preferable to use a material which is made elastomeric after being cured particularly using a liquid photosensitive resin composition which is cured with light in terms of processability into a sheeted or cylindrical printing plate.

Specific examples of thermoplastic elastomers that are used for the cushion layer may include styrene thermoplastic elastomers such as SBS (polystyrene-polybutadiene-polystyrene), SIS (polystyrene-polyisoprene-polystyrene), SEBS (polystyrene-polyethylene/polybutylene-polystyrene), olefin thermoplastic elastomers, urethane thermoplastic elastomers, ester thermoplastic elastomers, amide thermoplastic elastomers, silicon thermoplastic elastomers and fluorine thermoplastic elastomers.

Photo-curable elastomers may include materials obtained by mixing a photopolymerizable monomer, a plasticizer, a photopolymerization initiator and the like with the above described thermoplastic elastomers, and liquid compositions obtained by mixing a photopolymerizable monomer, a photopolymerization initiator and the like with plastomer resins. In the present invention, the degree of freedom is extremely high in selection of a material, since unlike the concept of design of a photosensitive resin composition for which a function of formation of fine patterns is an important factor, it is not necessary to form fine patterns using light, but it is only necessary that a certain degree of mechanical strength can be ensured by curing the composition by exposure of the entire surface to light.

Furthermore, sulfur crosslinking rubbers, and non-sulfur crosslinking rubbers such as organic peroxides, phenol resin initial condensates, quinone dioxime, metal oxides and thiourea may be used.

Further, a material obtained by three-dimensionally crosslinking a terekeric liquid rubber using a reactive curing agent to make the rubber elastomeric may be used.

When multiple layers are laminated in the present invention, the above described back film may be positioned under the cushion layer, i.e. in a lowermost part of the printing original plate, or between the photosensitive resin layer capable of laser engraving and the cushion layer, i.e. at the center of the printing original plate.

By forming a modification layer on the surface of the laser engravable printing substrate of the present invention, reduction of tacks on the surface of the printing plate and improvement of the ink wettability can be achieved. Modification layers may include coating films treated with a compound reacting with a surface hydroxyl group, such as a silane coupling agent or a titanium coupling agent, coating films treated with a treatment liquid containing a silicone compound, or polymer films containing porous inorganic particles.

Silane coupling agents that are widely used are compounds having in a molecule a functional group highly reactive with a surface hydroxyl group of the substrate. Such functional groups may include, for example, a trimethoxylsilyl group, a triethoxysilyl group, a trichlorosilyl group, a diethoxysilyl group, a dimethoxysilyl group, dimonochlorosilyl group, a monoethoxysilyl group, a monomethoxysilyl group and a monochlorosilyl group. For these functional groups, at least one functional group exists in a molecule, and reacts with a surface hydroxyl group of the substrate to be fixed on the surface of the substrate. Further, for compounds constituting the silane coupling agent of the present invention, compounds having at least one functional group selected from the group consisting of an acryloyl group, methacryloyl group, an active hydrogen-containing amino group, an epoxy group, a vinyl group, a perfluoroalkyl group and a mercapto group as a reactive functional group in a molecule, or compounds having a long chain alkyl group may be used.

Titanium coupling agents may include compounds such as isopropyl triisostealoyl titanate, isopropyl tris(dioctylpyrophosphate) titanate, isopropyl tri(N-aminoethyl-aminoethyl) titanate, tetraoctyl bis(di-tridecyl-phosphite) titanate, tetra(2, 2-diallyoxymethyl-1-butyl)bis(di-tridecyl)phosphite titanate, bis(octylpyro-phosphate)oxyacetate titanate, bis(dioctylpyro-phosphate)ethylene titanate, isopropyl trioctanoyl titanate, isopropyl dimethacryl isostealoyl titanate, isopropyl tridodecylbenzene sulfonyl titanate, isopropyl isostealoyl diacryl titanate, isopropyl tri(dioctyl sulfate) titanate, isopropyl tricumyl phenyl titanate and tetraisopropyl bis(dioctyl phosphate) titanate.

If the coupling agent molecule or the silicone compound fixed on the surface particularly has a polymerizable reactive group, the coating film can made stronger by crosslinking the compound by applying light, heat or an electron beam after it is fixed on the surface.

In the present invention, the aforementioned coupling agent is diluted with a mixture of water-alcohol or aqueous acetic acid-alcohol to adjust the concentration of the coupling agent as necessary. The concentration of the coupling agent in the treatment liquid is preferably 0.05 to 10.0 wt %.

The coupling agent treatment process in the present invention will be described. A treatment liquid containing the above described coupling agent is coated on the surface of the printing substrate or the printing plate after laser engraving. The process for coating the coupling agent treatment liquid is not specifically limited, and a dipping process, a spray process, a roll coat process, a brush coating process or the like may be applied. The coating treatment temperature and the coating treatment time are not specifically limited, but the treatment temperature is preferably 5 to 60° C. and the treatment time is preferably 0.1 to 60 seconds. Further, a treatment liquid layer on the surface of the resin plate is preferably dried under heating, and the heating temperature is preferably 50 to 150° C.

Before the surface of the printing plate is treated with the coupling agent, hydroxyl groups can be generated on the surface of the printing plate to fix the coupling agent densely by a method in which light of a xenon excimer lamp or the like in a vacuum ultraviolet range having a wavelength of 200 nm or less is applied, or a method in which the surface is exposed to a high-energy atmosphere of plasma or the like.

If a layer containing inorganic porous material particles is exposed at the surface of the printing plate, very small irregularities can be formed on the surface of the printing plate by treating the layer under a high-energy atmosphere of plasma or the like and slightly etching away an organic layer on the surface. By this treatment, tacks on the surface of the printing plate are reduced, and inorganic porous material particles exposed at the surface are made to easily absorb an ink, whereby an effect of improvement of the ink wettability can also be expected.

In laser engraving, an image to be formed is converted to digital data, and a laser apparatus is operated using a computer to form a relief image on the original plate. The laser for use in laser engraving is any laser as long as it includes a wavelength at which the original plate has an absorption, but a laser of high output is desired for performing sculpture at a high speed, and a carbon dioxide gas laser, a YAG laser, or an infrared or infrared emission solid laser such as a semiconductor laser is one of preferable lasers. A second higher harmonic wave of a YAG laser, a copper vapor laser, an ultraviolet laser having an oscillation wavelength in an ultraviolet range, for example an excimer laser, and a YAG laser having a wavelength converted to a third or fourth higher harmonic wave are capable of abrasion processing to cut a bond of an organic molecule, and are suitable for microprocessing. The laser may be either a continuous irradiation laser or a pulse irradiation laser. The resin generally has an optical absorption at near a wavelength of 10 μm which is an oscillation wavelength of a carbon dioxide gas laser, and therefore it is not particularly necessary to add a component to help absorption of laser light, but the YAG laser has a wavelength near 1.06 μm, and there are not many resins having an absorption at this wavelength. A dye or a pigment as a component to help the absorption is preferably added. Examples of such dyes include poly (substituted) phthalocyanine compounds and metal-containing phthalocyanine compounds; cyanine compounds; squarryum dyes; chalcogenopyrilo allylidene dyes; chloronium dyes; metal thiolated dyes; bis(chalcogenopyrilo)polymethine dyes; oxyindolizine dyes; bis(aminoaryl)polymethine dyes; melocyanine dyes; and quinoide dyes. Examples of pigments include dark-color inorganic pigments such as carbon black, graphite, copper chromite, chrome oxide, cobalt chrome aluminate, copper oxide and iron oxide, metal powders of iron, aluminum, copper, zinc and the like, and these metals doped with Si, Mg, P, Co, Ni, Y and the like. These dyes and pigments may be used alone, or may be used in combination of two or more types, or may be combined in any form such as a multilayered structure. However, in the case of a system in which the photosensitive resin composition is cured using light, the added amount of organic/inorganic compound as a dye or pigment having a large optical absorption at a wavelength of light for use in curing is preferably within a range of not impairing photocurability, and the ratio of addition to the total amount of photosensitive resin composition is preferably 5 wt % or less, more preferably 2 wt % or less.

Sculpture with a laser is carried out under an oxygen-containing gas, generally under the presence of air or a gas stream, but may be carried out under carbon dioxide gas or nitrogen gas. Powdered or liquid materials emerging in a slight amount on the surface of a relief printing plate after completion of sculpture may be removed using an appropriated method, for example a method in which the materials are washed out with a solvent, water containing a surfactant, or the like, a method in which an aqueous cleaner is jetted by a high-pressure spray or the like, or a method in which high-pressure steam is jetted.

In the present invention, the surface of a laser engraved printing substrate may be heated to aid laser engraving when applying laser light to the laser engraved printing substrate to form recessed patterns. Methods for heating the laser engraved printing substrate may include a method in which a sheeted or cylindrical platen of a laser engraving machine is heated using a heater, and a method in which the surface of the laser engraved printing substrate is directly heated using an infrared heater. By this heating step, a laser engraving characteristic can be improved. The level of heating is preferably in a range from 50° C. or more to 200° C. or less, more preferably in a range from 80° C. or more to 200° C. or less, further preferably in a range from 100° C. or more to 200° C. or less.

In the present invention, post-exposure in which light having a wavelength of 200 nm to 450 nm is applied to the surface of a printing plate on which patterns are formed may be carried out subsequently to a step of removing powdered or viscous liquid debris remaining on the surface of the plate after engraving for applying laser light to form recessed patterns. The post-exposure is a method that is effective in removal of tacks on the surface. The post-exposure may be in any of environments of air, an inert gas atmosphere and water. The post-exposure is especially effective when a hydrogen extraction photopolymerization initiator is contained in the photosensitive resin composition used. Further, before the post-exposure step, the surface of the printing plate may be treated with a treatment liquid containing a hydrogen extraction photopolymerization initiator and then exposed. The printing plate may be exposed to light with the printing plate immersed in the treatment liquid containing a hydrogen extraction photopolymerization initiator.

The printing substrate of the present invention can be applied and used for various kinds of applications such as stamps/seals, design rolls for embossing, relief images for patterning of insulator, resistor and conductor pastes for use in fabrication of electronic components, formation of patterns of functional materials such as antireflection films, color filters and (near) infrared absorbing filters of optical components, coating/formation of patterns of alignment layers, ground layers, luminescent layers, electron transport layers and sealing layers in production of display elements of liquid crystal displays, organic electroluminescent displays or the like, relief images for mold materials of ceramic products, relief images for displays of advertisement/display plates, molds/matrixes of various kinds of molded products, screen printing plates, rotary screen printing plates, blankets for printing, ink amount adjusting rolls which are used in contact with an anilox roll, in addition to relief images for printing plates.

The present invention will be described below based on examples, but the present invention is not limited to these examples.

(1) Laser Engraving

Laser engraving was carried out using a carbon dioxide gas sculpture machine (trade mark: ZED-mini-1000 manufactured by ZED Co., Ltd. (United Kingdom) with a carbon dioxide gas laser of output of 250 W manufactured by Coherent Co., Ltd. (United States)). Engraving was carried out by forming patterns including dots (area rate of 10% with 80 lines per inch), line drawings by salient lines having a width of 500 µm and void lines having a width of 500 µm. Since the area of the top part of fine dot portion patterns cannot be ensured and the patterns get out of shape and become unclear if the sculpture depth is set to be large, the engraving depth was set to 0.55 mm.

(2) Number of Times of Removal of Debris and Residual Ratio of Debris

Debris on a relief printing plate after laser engraving was wiped off using a nonwoven fabric (trade mark: BEMCOT M-3 manufactured by Asahi Kasei Corporation (Japan)) impregnated with ethanol or acetone. The number of removal operations required for removal of sticky liquid debris generated after sculpture was the number of times of removal of debris. If the number of times is high, it means that the amount of liquid debris is large. The number of times of removal of debris for an excellent printing plate is 5 or less, preferably 3 or less.

Further, the weights of the printing substrate before laser engraving, the printing plate just after laser engraving and the relief printing plate after wiping off debris were measured, and the residual ratio of debris at the time of sculpture was determined according to the following formula.

(weight of plate just after engraving−weight of plate after wiping off debris)÷(weight of original plate before sculpture−weight of plate after wiping off debris)×100

The residual ratio of debris for an excellent printing plate is preferably 15 wt % or less, more preferably 10 wt % or less. After removal of debris remaining on the relief, post light exposure of applying an ultraviolet ray to the surface of the printing plate was carried out. Light used for post light exposure was light of an ultraviolet fluorescent lamp (chemical lamp, central wavelength: 370 nm) and a bacteriocidal lamp (germicidal lamp, central wavelength: 253 nm).

(3) Shape of Dot Portions

The shape of dot portions of 80 lpi (lines per inch) and with the area rate of about 10%, of engraved portions, was observed by an electron microscope under magnification of 200× to 500×. If dots have a conical shape or a pseudo conical shape (divergent shape obtained by cutting a conical at near its top with a plane parallel to the bottom face of the conical), the printing plate is satisfactory as for the shape of dot portions.

(4) Pore Volume, Average Pore Diameter and Specific Surface Area of Porous Material and Non-Porous Material 2 g of porous material or non-porous material was taken into a sample tube, and dried under a reduced pressure by a pretreatment apparatus under conditions of 150° C. and 1.3 Pa or less for 12 hours. The pore volume, the average pore diameter and the specific surface area of the dried porous material or non-porous material were measured with nitrogen gas adsorbed under an atmosphere of the temperature of liquid nitrogen using AUTOSORP 3 MP (trade mark) manufactured by Quantachrome Corporation (United States). Specifically, the specific surface area was calculated based on the BET equation. The pore volume and the average pore diameter was calculated based on a pore distribution analysis method called a BJH (Brrett-Joyner-Halenda) method assuming a cylindrical model from an absorption isotherm at the time of desorption of nitrogen.

(5) Ignition Loss of Porous Material and Non-Porous Material

The weight of a porous material or non-porous material for measurement was recorded. A sample for measurement was then put in a high-temperature electric oven (trade mark: FG31 Model manufactured by Yamato Scientific Co., Ltd. (Japan)), and treated under a condition of 950° C. for 2 hours under an air atmosphere. A change in weight after the treatment was determined to be an ignition loss.

(6) Standard Deviation in Particle Diameter Distribution of Porous Material and Non-Porous Material The measurement of the particle diameter distribution of the porous material and non-porous material was carried out using a laser diffraction particle diameter distribution measuring apparatus (trade mark: SALD-2000 J Model manufactured by Shimadzu Corporation (Japan)). For the specification of the apparatus, it is described in the catalog that measurement for a particle diameter range from 0.03 µm to 500 µm is possible. Using methyl alcohol as a dispersion medium, an ultrasonic wave was applied for about 2 minutes to disperse particles to prepare a measurement liquid.

(7) Viscosity

The viscosity of a photosensitive resin composition was measured at 20° C. using a Brookfield type viscometer (trade mark: B8H Model manufactured by Tokyo Keiki Co., Ltd. (Japan)).

(8) Taper Abrasion Test

A printing substrate having a thickness of 2.8 mm was fabricated separately, and the taper abrasion test was carried out in accordance with JIS-K6264. A load applied on a test piece was 4.9 N, the rotation speed of a rotation disk was 60±2 per minute, the number of tests was 1000 on a continuous basis, and an abrasion loss after the test was measured. The area of a test section was 31.45 cm$^2$. For an excellent printing plate, the abrasion loss is preferably 80 mg or less, and if the abrasion loss is low, the printing substrate can be used for a long time period, and high-quality printed matters can be provided.

(9) Measurement of Surface Frictional Resistance

A printing substrate having a thickness of 2.8 mm was fabricated separately, and a surface frictional resistance value µ was measured using a friction measuring apparatus (trade mark: TR Model manufactured by Toyo Seiki Seisaku-Sho, Ltd (Japan)). A sinker placed on the surface of the sample had a size of 63.5 mm square and a weight W of 200 g, and the speed of pulling the sinker was 150 mm/minute. A liner paper (paper including no recycled paper, produced from a pure pulp and having a thickness of 220 μm, which is used for a cardboard; trade name "White Liner" manufactured by Oji Paper Co., Ltd.) was attached to the surface of the sinker such that its flat surface was exposed at the surface, and the sinker was horizontally moved such that the liner paper existed between the printing substrate and the sinker and the surface of the printing substrate and the flat surface of the liner paper were in contact with each other to measure the surface frictional resistance value μ. The surface frictional resistance value μ is a ratio of a measured load Fd to the weight of the sinker, namely a coefficient of dynamic friction expressed by μ=Fd/W, and is a dimensionless number. The average value of measured loads in a range where measurement values were stabilized after starting movement of the sinker, namely a range from 5 mm to 30 mm was determined to be Fd. The surface frictional resistance value μ is preferably low for the printing plate. For an excellent printing plate, the surface frictional resistance value μ is 2.5 or less, and if the surface frictional resistance value μ is low, deposition of a paper powder on the surface of the printing plate at the time of printing is low, and high-quality printed matters can be thus obtained. If the surface frictional resistance value μ exceeds 4, a phenomenon of deposition of a paper powder on the surface of the printing plate occurs at the time of printing on a paper such as a cardboard, and in this case, an ink is often prevented from being transferred onto a printed matter in an area on which the paper powder is deposited, leading to defects.

(10) Measurement of the Number Average Molecular Weight

The number average molecular weights of the resin (a) and the organic silicon compound (c) were determined by using a gel permeation chromatograph method (GPC method) and performing conversion with respect to polystyrene of which the molecular weight was known. A high speed GPC apparatus (trade mark: HLC-8020 manufactured by Tosoh Corporation (Japan)) and a polystyrene packed column (trade mark: TSKgel GMHXL manufactured by Tosoh Corporation (Japan) were used to make measurements by development with tetrahydrofuran (THF). The temperature of the column was set to 40° C. As a sample injected into the GPC apparatus, a THF solution having a resin concentration of 1 wt % was prepared, and the injected amount was 10 μl. As a detector, an ultraviolet absorption detector was used for the resin (a), and light of 254 nm was used as monitor light. For the organic silicon compound (c), detection was carried out using parallax refractometer. For the resin (a) and the organic silicon compound (c) for use in examples and Comparative Examples of the present invention, the polydispersity (Mw/Mn) determined using the GPC method was more than 1.1, and therefore the number average molecular weight Mn determined by the GPC method was employed. For the organic compound (b), the polydispersity (Mw/Mn) determined using the GPC method was less than 1.1, and therefore the molecular weight was calculated from a molecular structure identified using the nuclear magnetic resonance spectrometry method (NMR method).

(11) Measurement of the Number of Polymerizable Unsaturated Groups

The average number of polymerizable unsaturated groups existing in a molecule of the synthesized resin (a) were determined by removing unreacted low molecular components using a liquid chromatograph method and then analyzing a molecular structure using nuclear magnetic resonance spectrometry (NMR method).

(12) Printing Evaluation

A printing plate fabricated by laser engraving was used to carry out printing evaluation. For printing, a bench proof press (trade mark "Flexiploofer100" manufactured by KR Co., Ltd. (United Kingdom)) was used, the above described printing plate was attached on a printing cylinder using a double-coated tape, and printing was done on a coated paper in a sheet-fed manner using a cyan aqueous ink. In a state of applying an excessive pressure between the anilox roll and the printing cylinder (state of applying a pressure greater by 0.08 mm as compared to a state of uniform transfer of the ink to the plate) and just after doing printing for 10 sheets with a pressure between the printing cylinder and an impression cylinder set to 0.15 mm, the level of ink residuals remaining on the plate surface was visually observed.

(13) Test on Wettability of Printing Substrate

For the test on wettability of the surface of the laser engraved printing substrate, 20 μl of indicator of surface energy of 30 mN/m (trade mark "Wetting Tension Test Mixture No. 30.0" manufactured by Wako Pure Chemical Industries, Ltd.) was added dropwise onto the surface of the laser engraved printing substrate using a quantitative and fixed type micropipette, a maximum diameter of an area where the above described droplet spread was measured after 30 seconds, and this value was used as an index for the wettability test. The higher this value, the more easily the surface is wetted with the indicator. For a suitable laser engraved original plate, this value is 4 mm or more and 20 mm or less.

(14) Solid $^{29}$SiNMR Measurement

The solid $^{29}$SiNMR measurement was carried out using "DSX400" (trade name) manufactured by Bruker Co., Ltd. The measurement was carried out under conditions of observed nucleus: $^{29}$Si, observation frequency: 79.4887 MHz, the number of integrations: 540, pulse width: 6μ seconds, wait time: 480 seconds, MAS (magic angle rotation speed): 3500 Hz, magic angle spinning: 5000 Hz, pulse program: hpdec (high power decoupling), and sample tube diameter: 7 mmφ. As an external reference for chemical shifts, a measurement was made on a dimethyl silicone rubber separately, and one peak obtained was determined to be −22 ppm.

(15) Plasma Emission Spectrometry

A precisely weighed piece of laser engraved printing substrate was subjected a dry ashing process of carbonizing the piece by a heater and ashing the carbonized piece by an electric oven at 500° C., and then processed by an alkali melting process of mixing therewith two types of alkali melting agents (powders), i.e. potassium sodium carbonate and sodium tetraborate and melting the resultant mixture at 1200° C., a sample thus obtained was cooled, and then dissolved in hydrochloric acid, and a measurement was made using a plasma emission spectrometer (trade name "IRIS/AP" manufactured by Thermo Element Co., Ltd.). The measurement wavelength was 251.612 nm. The radiant intensity of the sample was compared with a calibration curve prepared in advance, whereby the concentration of silicon existing in the system was estimated, and from the estimated concentration and the weight of the laser engraved printing original plate measured in advance, the abundance ratio of silicon in the laser engraved printing original plate was estimated.

(16) Pyrolysis GC/MS Measurement

The GC/MS measurement was carried out using "HP5973" (trade name) manufactured by Agilent technologies Co., Ltd. A sample heat-decomposed with the temperature of a heating oven set to 550° C. using a pyrolysis apparatus (trade name "Py-2020D" manufactured Frontier Laboratories Ltd.) was introduced into a GC/MC to be separated and identified. Mass analysis was carried out by ionizing a sample using electron ionization mass spectrometry. The sample placed in a pyrolysis oven was precisely weighed to about 0.3 mg.

(17) Measurement of Shore A Hardness

The measurement of the Shore A hardness was carried out using an automatic hardness meter manufactured by Zwick Co., Ltd. (Germany). As a value of the Shore A hardness, a value 15 seconds after the measurement was employed.

(18) Measurement of ASKER-C Hardness

In the case of a cushion layer having air bubbles, the ASKER-C hardness is preferably measured. The measurement of the ASKER-C hardness was carried out using a rubber/plastic hardness meter (trade mark "ASKER-C Model" manufactured by Koubunshi Keiki Co., Ltd.). A value of the ASKER-C hardness, a value 15 seconds after the measurement was employed.

(19) Measurement of Haze

The haze of the photosensitive resin composition was measured using a haze meter (trade mark "NDH-1001DP" manufactured by Nippon Denshoku Co., Ltd.). The photosensitive resin composition was molded to have a thickness of 1 mm. In the case of a photosensitive resin composition which was liquid at 20° C., a bank made of rubber having a thickness of 1 mm was provided on a PET film, a liquid photosensitive resin was filled in the bank, and the bank was covered with the PET film from the other side to prepare a sample, and the sample was used for the measurement.

Production Example 1

To a 1 L separable flask having a thermometer, a stirrer and a circulator were added 447.24 g of polycarbonate diol (trade mark "PCDL L4672" (number average molecular weight: 1990; and OH value: 56.4) manufactured by Asahi Kasei Corporation) and 30.83 g of tolylene diisocyanate, the mixture was allowed to react for about 3 hours under heating at 80° C., 14.83 g of 2-methacryloyl oxyisocyanate was then added, and the mixture was further allowed to react for about 3 hours to produce a resin (a1) having a methacryl group (having about two intramolecular polymerizable unsaturated groups per molecule on the average) at the end and having a number average molecular weight of about 10000. This resin was in the form of thick malt syrup at 20° C., was fluidized when applying an external force, and did not recover its original shape even when removing the external force.

Production Example 2

To a 1 L separable flask having a thermometer, a stirrer and a circulator were added 447.24 g of polycarbonate diol (trade mark "PCDL L4672" (number average molecular weight: 1990; and OH value: 56.4) manufactured by Asahi Kasei Corporation) and 30.83 g of tolylene diisocyanate, the mixture was allowed to react for about 3 hours under heating at 80° C., 7.42 g of 2-methacryloyl oxyisocyanate was then added, and the mixture was further allowed to react for about 3 hours to produce a resin (a2) having a methacryl group (having about one intramolecular polymerizable unsaturated group per molecule on the average) at the end and having a number average molecular weight of about 10000. This resin was in the form of thick malt syrup at 20° C., was fluidized when applying an external force, and did not recover its original shape even when removing the external force.

Production Example 3

To a 1 L separable flask having a thermometer, a stirrer and a circulator were added 500 g of polytetramethylene glycol (number average molecular weight: 1830; and OH value: 61.3) manufactured by Asahi Kasei Corporation) and 52.40 g of tolylene diisocyanate, the mixture was allowed to react for about 3 hours under heating at 60° C., 6.2 g of 2-hydroxypropyl methacrylate and 7.9 g of polypropylene glycol monomethacrylate (Mn 400) were the added, the mixture was further allowed to react for 2 hours, 20 g of ethanol was then added, and the mixture was further allowed to react for 2 hours. A resin (a3) having a methacryl group (having about 0.5 intramolecular polymerizable unsaturated groups per molecule on the average) at the end and having a number average molecular weight of about 20000 was produced. This resin was in the form of thick malt syrup at 20° C., was fluidized when applying an external force, and did not recover its original shape even when removing the external force.

Production Example 4

To a 1 L separable flask having a thermometer, a stirrer and a circulator were added 400 g of polyester diol (trade mark "Kuraray Polyol P3010" (number average molecular weight: 3160; and OH value: 35.5) manufactured Kuraray Co., Ltd.) and 19.13 g of tolylene diisocyanate, the mixture was allowed to react for about 3 hours under heating at 80° C., 6.74 g of 2-methacryloyl oxyisocyanate was then added, and the mixture was further allowed to react for about 3 hours to produce a resin (a4) having a methacryl group (having about two intramolecular polymerizable unsaturated groups per molecule on the average) at the end and having a number average molecular weight of about 25000. This resin was in the form of thick malt syrup at 20° C., was fluidized when applying an external force, and did not recover its original shape even when removing the external force.

Examples 1 to 7 and Comparative Examples 1 to 3

The resins (a1) to (a3) prepared in production Examples 1 to 3 were used as the resin (a) which was a plastomer at 20° C., a polymerizable monomer, an organic silicon compound (c), an inorganic porous material (f), a photopolymerization initiator and other additives were added as shown in Table 1 to prepare a resin composition.

As the organic silicon compound (c) used, a methylstyryl modified silicone oil (trademark "KF-410"; refractive index: 1.480; and number average molecular weight: 6510 as a weighted average because two peaks with one at 7890 and the other at 700 were shown, and their peak area ratio was 4.2:1; and liquid at 20° C.) and a carbinol modified silicone oil (trade mark "KF-160AS"; refractive index: 1.420; number average molecular weight: 750; and liquid at 20° C.) manufactured by Shin-Etsu Chemical Co., Ltd., and a methyl phenyl silicone oil (trade mark "SH510"; refractive index: 1.500; number average molecular weight: 2890; and liquid at 20° C.) manufactured by Toray Dow Corning Silicone Co., Ltd.) were used. These compounds were silicone compounds having no polymerizable unsaturated group in a molecule.

As a result of making a measurement using a haze meter, the haze of the photosensitive resin composition obtained was in a range from 25% to 30% in Examples 1, 2, 3, 6 and 7 in which the methylstyryl modified silicone oil was used. The haze was 50% in Example 4 in which the carbinol modified silicone oil was used, and further, the haze was 90% in Example 5 in which the methyl phenyl silicone oil was used.

As the inorganic porous material (f), porous fine powdered silica (trade mark "Sylosphere C-1504" (hereinafter abbreviated as C-1504; number average particle diameter: 4.5 μm, specific surface area: 520 m$^2$/g; average pore diameter: 12 nm; pore volume: 1.5 ml/g; ignition loss: 2.5 wt %; and oil absorption: 290 ml/100 g), trade mark "Sylysia 450" (hereinafter abbreviated as CH-450; number average particle diameter: 8.0 μm, specific surface area: 300 m²/g; average pore diameter: 17 nm; pore volume: 1.25 ml/g; ignition loss: 5.0 wt %; and oil absorption: 200 ml/100 g), and trade mark "Sylysia 470" (hereinafter abbreviated as C-470; number average particle diameter: 14.1 μm, specific surface area: 300 m²/g; average pore diameter: 17 nm; pore volume: 1.25 ml/g; ignition loss: 5.0 wt %; and oil absorption: 180 ml/100 g)) manufactured by Fuji Silysia Chemical Ltd. was used. The degree of porosity of porous fine powdered silica used was 780 for Sylosphere C-1504 and 800 for Sylysia 450 when calculated with the density set to 2 g/cm³. The sphericity of Sylosphere C-1504 as porous spherical silica added was 0.9 or more for almost all particles when observed using a scanning electron microscope. Sylysia 450 and Sylysia 470 were porous silica but not spherical silica.

The prepared photosensitive resin composition was molded on a PET film in the form of a sheet having a thickness of 2.8 mm, and an ultraviolet ray from a high pressure mercury lamp was applied from a surface at which a photosensitive resin layer was exposed in air. The amount of energy applied was 4000 mJ/cm² (value obtained by time-integrating illuminances measured by UV-35-APR Filter (trade mark) manufactured by ORC Manufacturing Co., Ltd.). The lamp illuminance at the irradiation surface was measured using a UV meter (trade mark "UV-M02" manufactured by ORC Manufacturing Co., Ltd.). The lamp illuminance measured using UV-35-APR Filter was 19 mW/cm² and the lamp illuminance measured using UV-25 Filter was 2.9 mW/cm². For Example 6, the photosensitive resin composition was molded on a PET film in the form of a sheet having a thickness of 2.8 mm, the surface was then covered with a PET cover film having a thickness of 15 μm, and light from the above described high pressure mercury lamp was applied in a state of blocking oxygen to cure the photosensitive resin composition to fabricate a sheeted printing substrate.

The photopolymerization initiator used was a hydrogen extraction photopolymerization initiator (d) for benzophenone (BP) and a degradable photopolymerization initiator for 2,2-dimethoxy-2-phenylacetophenone (DMPAP).

The photosensitive resin compositions of Examples 1 to 7 and Comparative Examples 1 to 3 were all liquid at 20° C. The viscosity measured using a Brookfield type viscometer was 5 kPa·s at 20° C. in every system.

Engraving patterns was performed on the printing substrates using a laser engraving machine manufacture by ZED Co., Ltd. The results of evaluation thereof are shown in Table 2.

The results of measurements of surface frictional resistance values and taper abrasion resistance tests are shown in Table 2. Comparative Examples 1 to 3 in which no organic silicon compound (c) was included showed high values for both the surface frictional resistance value and abrasion loss as compared to Examples 1 to 7. The results of wettability tests are shown in Table 2, and the size of the spreading of the indicator is within a range from 4 mm or more to 20 mm or less for examples, whereas the size exceeds 20 mm for all Comparative Examples.

The number of times of wipe of debris after sculpture in Table 2 refers to the number of times of wipe processing required for removing sticky liquid debris generated after sculpture, and if this number of times is large, it means that the amount of liquid debris is large.

Figure 2:
FIG. 2 is a photograph of the surface of a plate after evaluation of printing in Comparative Example 1 of the present invention.

From the printing evaluation, the level of ink residuals on the plate surface was satisfactory for Examples 1 to 7, but for Comparative Examples 1 to 3, the ink apparently remained in blue color, and could not be removed although the surface was wiped with a cloth soaked with ethanol. Photographs showing the appearance of the plate after printing evaluation in Example 1 and Comparative Example 1 are shown in FIG. 1 and FIG. 2, respectively. In the figures, black areas show ink residuals. In FIG. 2, the remaining of the ink is obvious.

A double-coated tape was stuck on a sleeve made of a fiber reinforcement plastic mounted in an air cylinder and having an inner diameter of 213 mm and a thickness of 2 mm, and the aforementioned sheeted printing substrate prepared separately was wrapped over the tape to be fixed. An adhesive was filled in areas of joints and cured. The cylinder was rotated by a turning machine and a cemented carbide cutting bite was used to carry out cutting processing until the thickness became 2.5 mm. For Examples 1 to 7, processing was completed while debris generated in cutting processing did not cling to the cutting bite. However, for Comparative Examples 1 to 3, debris clung to the cutting bite, and on every such occasion, the operation was stopped for remove the debris. For Comparative Examples 1 to 3, a plurality of deep cutting marks remained on the surface. Thereafter, for samples of Examples 1 to 7 and Comparative Examples 1 to 3, the surface was subjected to polishing processing using a film polishing cloth. For Examples 1 to 7, no cutting marks remained, and an even smooth surface could be obtained. However, for Comparative Examples 1 to 3, cutting marks partly remained even after carrying out polishing processing.

A solid 29SiNMR spectrum was measured using as a sample a cured photosensitive resin capable of laser engraving obtained in Example 1. A forked sharp peak originating from a silicone compound as an organic silicon compound in a chemical shift at and around −22 ppm, and a broad peak centered at and around −110 ppm and originating from porous silica as an inorganic silicon compound were observed. A ratio of integral values of the peak originating from the silicone compound and the peak originating from porous silica ($I_{org}$:$I_{ino}$) was 1.0:7.37. It is estimated that the forked sharp peak originating from the silicone compound corresponded to a dimethylsiloxane moiety and a siloxane moiety having a methyl group and a methyl styryl group, and the ratio of integral values was 2:1. This ratio of integral values coincided with the result of separately making a ¹H-NMR measurement of the silicone compound (trade mark "KF-410" manufactured by Shin-Etsu Chemical Co., Ltd.) used.

Plasma emission spectrometry was carried out using as a sample the cured photosensitive resin capable of laser engraving obtained in Example 1. From comparison of the radiant intensity with a calibration curve, the abundance ratio ($W_{Si}$) of Si contained in the sample was 2.22 wt %. Thus, from the result of plasma emission spectroscopy and the result of solid ²⁹SiNMR, the abundance ratio of Si originating from the organic silicon compound was determined to be 0.27 wt % from the formula: 2.22×(1.0/(1.0+7.37)).

Further, as a result of analyzing the cured photosensitive resin capable of laser engraving obtained in Example 1 using the pyrolysis GC/MS method, a compound presumed to be a cyclic siloxane compound having as basic units a dimethylsiloxane moiety and a siloxane moiety having a methyl group and a methylstyryl group was detected in a mass spectrometer.

Example 8

A double-coated tape was stuck on a sleeve made of a fiber reinforcement plastic having an inner diameter of 213 mm and a thickness of 2 mm, and a PET film coated with an adhesive was attached on the tape such that the adhesive was exposed at the surface to form a cylindrical support. A photosensitive resin composition same as that in Example 1 was heated to 50° C. and coated having a thickness of about 2 mm on the cylindrical support using a doctor blade. Thereafter, light from the high pressure mercury lamp same as that used in Example 1 was applied in an amount of 4000 mJ/cm$^2$ (value obtained by time-integrating the illuminance measured by UV-35-APR Filter) in air to cure a photosensitive resin composition layer. Thereafter, the sleeve was mounted in an air cylinder, and placed in a turning machine, and cutting was then performed using a cemented steel bite while the air cylinder was rotated until the thickness including the PET film became 1.7 mm. The cutting step was completed while cut debris did not cling to the bite in the cutting step. Further, using a polishing film, polishing was performed while sprinkling a small amount of water to obtain a cylindrical printing substrate having a smooth surface on which no cutting mark was observed.

Example 9

100 parts by weight of SBS thermoplastic elastomer (SBS: polystyrene/polybutadiene/polystyrene block copolymer) having a number average molecular weight of about 130,000 as the resin (a), 5 parts by weight of 1,9-nonanediol diacrylate as the organic compound (b), 30 parts by weight of liquid polybutadiene having a number average molecular weight of about 2000 as a plasticizer, 0.6 parts by weight of 2,2-dimethoxy-2-phenylacetophenone and 1 part by weight of benzophenone as a photopolymerization initiator, 0.3 parts by weight of 2,6-di-t-butyl-4-methylphenol as a polymerization inhibitor, and 1 part by weight of methylstyryl modified silicone oil manufactured (trade mark "KF-410") manufacture by Shin-Etsu Chemical Co., Ltd. were kneaded at 130° C. using a kneader to obtain a photosensitive resin composition that was solid at 20° C.

Using an extruder, the obtained photosensitive resin composition was heated and extruded having a thickness of 2 mm onto a PET film having a thickness of 125 μm to form a sheeted photosensitive resin composition.

A double-coated tape was stuck on a sleeve made of a fiber reinforcement plastic having an inner diameter of 213 mm and a thickness of 2 mm, the above described sheeted photosensitive resin composition was wrapped over the tape such that a PET film was on the inner side, and thereby the photosensitive resin composition was fixed. The above described photosensitive resin composition was filled in gaps in areas of joints and heated to be fused, whereby a seamless cylindrical photosensitive resin composition was obtained. Thereafter, light from the high pressure mercury lamp same as that in Example 1 was applied in an amount of 4000 mJ/cm$^2$ (value obtained by time-integrating the illuminance measured by UV-35-APR Filter) to obtain a cured photosensitive resin.

Thereafter, the sleeve was mounted in an air cylinder, and placed in a turning machine, and cutting was then performed using a cemented carbide bite while the air cylinder was rotated until the thickness including the PET film became 1.7 mm. The cutting step was completed while cut debris did not cling to the bite in the cutting step. Further, using a film polishing cloth, polishing was performed while sprinkling a small amount of water to obtain a cylindrical printing substrate having a smooth surface on which no cutting mark was observed.

Example 10

The photosensitive resin composition was photo-cured to form a cushion layer of a printing substrate in the same manner as in Example 1 except that a liquid photosensitive resin composition (trade mark "APR, F320" manufactured by Asahi Kasei Corporation) was molded in the form of a sheet having a thickness of 2 mm. On this cushion layer, the liquid photosensitive resin composition used in Example 1 was coated having a thickness of 0.8 mm, and the printing substrate was fabricated through a subsequent light exposure step. The Shore A hardness of the cushion layer was 55 degrees.

The residual ratio of debris after sculpture with a carbon dioxide gas laser was 5.7 wt %, the number of times of wipe of debris after sculpture was 3 or less, and the shape of dot portions was conical and favorable.

The surface frictional resistance value and the abrasion loss in the taper abrasion test were comparable to those in Example 1.

Example 11

A printing substrate was fabricated in the same manner as in Example 1 except that organic porous spherical fine particles were used. The organic porous fine particles were composed of crosslinked polystyrene, and had a number average particle diameter of 8 μm, a specific surface area of 200 m$^2$/g and an average pore diameter of 50 nm. The surface of the printing substrate was cured.

After sculpture with a carbon dioxide gas laser, sticky liquid debris was generated in a large amount, and the required number of times of wipe of debris exceeded 30. It can be presumed that this is because organic porous fine particles were melted and decomposed by application of laser light, so that they could not retain porosity.

The surface frictional resistance value and the abrasion loss were comparable to those in Example 1.

Example 12

A double-coated tape was stuck on a sleeve made of a fiber reinforcement plastic having an inner diameter of 213 mm and a thickness of 2 mm, and a PET film coated with an adhesive was attached on the tape such that the adhesive was exposed at the surface to form a cylindrical support. A photosensitive resin composition prepared by removing benzophenone as a photopolymerization initiator from the photosensitive resin composition of Example 1 was heated to 50° C. and coated having a thickness of about 2 mm on the cylindrical support using a doctor blade. Thereafter, light from the above described high pressure mercury lamp was applied in an amount of 4000 mJ/cm$^2$ (value obtained by time-integrating the illuminance measured by UV-35-APR Filter) in air to cure a photosensitive resin composition layer.

To 100 parts by weight of the photosensitive resin composition of Example 1 was added 1 part by weight copper oxide ultrafine particles (trademark "Nano Tek CuO" manufactured by CIKASEI CO., LTD.) having an optical absorption in a near infrared wavelength range, and the mixture was stirred and deaerated using a planetary vacuum stirring and deaerating apparatus (trade mark "Mazerustar DD-300" manufactured by Kurabo Industries Ltd.) to prepare a black photosensitive resin composition. The black photosensitive resin composition heated to 50° C. was coated having a thickness of 0.1 mm on the above described cured cylindrical photosensitive resin layer using a doctor blade, and light from the above described high pressure mercury lamp was applied in an amount of 4000 mJ/cm$^2$ (value obtained by time-integrating the illuminance measured by UV-35-APR Filter) in air to cure a black photosensitive resin composition layer. Then, cutting was performed using the above described cemented carbide bite made of silicon nitride so that the thickness became 0.08 mm, and further, the surface was subjected to polishing processing using a film polishing cloth. Cut debris generated in the cutting step did not cling to the cemented carbide bite, and no cutting marks remained after polishing of the surface.

On the cylindrical laser engraved printing substrate thus formed, recessed patterns having a depth of 0.5 mm and a size of a 2 cm square were formed using a carbon dioxide gas laser engraving machine (trademark "ZED-mini-1000" manufactured by ZED Co., Ltd. (United Kingdom)), and further on the patterns, dot patterns having a depth of 0.01 mm were formed using a YAG laser engraving machine having a near infrared laser (trademark "CDI Classic" manufactured by ESKO-Graphics Co., Ltd. (Germany); laser wavelength: 1.06 µm). As a result of observing the formed dot patterns using an electron microscope, they were conical and favorable in shape.

A cylindrical printing substrate fabricated separately in the manner described above was cut by a cutter to separate a PET film from a double-coated tape, whereby a sheeted printing substrate was obtained. Using this sheeted printing substrate as a sample, the surface frictional resistance value and the abrasion loss in the taper abrasion test were measured, and results comparable to those in Example 1 were obtained.

Example 13

A liquid photosensitive resin composition was prepared in the same manner as in Example 1 except that the resin (a4) synthesized in production Example 4 was used as the resin (a) and 15 parts by weight of C-1504 as an inorganic porous material were added. A liquid photosensitive resin composition prepared in the same manner as in Example 8 was coated on a cylindrical support and photo-cured to form a cured cylindrical photosensitive resin.

Cutting processing and polishing processing were carried out using a cemented carbide bite while rotating the cured cylindrical photosensitive resin in the same manner as in Example 8. Debris generated at the time of cutting processing was sticky as compared to Example 8, but did not cling to the bite. Cutting marks after polishing processing were not observed, and a cylindrical printing substrate having a smooth surface could be obtained.

Concavo-convex patterns were formed on the surface of the obtained cylindrical printing substrate by a laser engraving machine, and engraving debris was wiped out five times to reach completion. Dot patterns were conical and favorable in shape.

Comparative Example 4

A double-coated tape was stuck on a sleeve made of a fiber reinforcement plastic having an inner diameter of 213 mm and a thickness of 2 mm, and a PET film coated with an adhesive was attached on the tape such that the adhesive was exposed at the surface to form a cylindrical support. A photosensitive resin composition same as that in Comparative Example 1 was heated to 50° C. and coated having a thickness of about 2 mm on the cylindrical support using a doctor blade. Thereafter, light from the high pressure mercury lamp same as that used in Example 1 was applied in an amount of 4000 mJ/cm$^2$ (value obtained by time-integrating the illuminance measured by UV-35-APR Filter) in air to cure a photosensitive resin composition layer. Thereafter, the sleeve was mounted in an air cylinder, and placed in a turning machine, and cutting was then performed using a cemented carbide bite while the air cylinder was rotated until the thickness including the PET film became 1.7 mm. In the cutting step, a phenomenon of clinging of cut debris to the bite occurred, and in the cutting step, rotation was stopped, and on every such occasion, an operation of removing cut debris from the blade of the bite was carried out. Further, using a film polishing cloth, polishing was performed while sprinkling a small amount of water. Cutting marks were observed slightly on the surface. The cutting marks could not fully be removed in the polishing step.

Comparative Example 5

A photosensitive resin composition having a composition same as that in Example 1 was prepared except that a methacryl modified silicone oil (trade mark "X-22-164C") manufactured by Shin-Etsu Chemical Co., Ltd. was used instead of the methylstyryl modified silicone oil (trade mark "KF-410") manufactured by Shin-Etsu Chemical Co., Ltd. The prepared photosensitive resin composition was liquid at 20° C., and opaque. As a result of measuring a haze using a haze meter, the haze was 92%.

A sheeted printing substrate having a PET sheet as a support was formed in the same manner as in Example 1. The debris residual ratio at the time of laser engraving, the number of times of wipe of debris, and the shape of dot portions were comparable to those in Example 1. The surface frictional resistance value was 0.65, the abrasion loss in the taper abrasion test was less than 0.5 mg, and the size of a spreading droplet in the wettability test was 8 mm. When a drop of ethanol was added dropwise in the droplet test, a phenomenon of rejection of a droplet occurred. This phenomenon did not occur in Example 1.

TABLE 1

|  | Resin (a) | | Organic compound (b) | | Inorganic porous material (f) | | Polymerization initiator | | Organic silicon Compound (c) | | Other additives | |
| --- | --- | --- | --- | --- | --- | --- | --- | --- | --- | --- | --- | --- |
|  | Type | Blended amount | Type | Blended amount | Type | Blended amount | Type | Blended amount | Type | Blended amount | Type | Blended amount |
| Example 1 | (a1) | 100 | PEMA | 37 | C-1504 | 7.7 | DMPAP | 0.9 | KF-410 | 1.5 | BHT | 0.5 |
|  |  |  | BDEGMA | 12 |  |  | BP | 1.5 |  |  |  |  |
| Comparative Example 1 | (a1) | 100 | PEMA | 37 | C-1504 | 7.7 | DMPAP | 0.9 | None |  | BHT | 0.5 |
|  |  |  | BDEGMA | 12 |  |  | BP | 1.5 |  |  |  |  |
| Example 2 | (a2) | 100 | PEMA | 37 | C-1504 | 7.7 | DMPAP | 0.9 | KF-410 | 1.5 | BHT | 0.5 |
|  |  |  | BDEGMA | 12 |  |  | BP | 1.5 |  |  |  |  |
| Comparative Example 2 | (a2) | 100 | PEMA | 37 | C-1504 | 7.7 | DMPAP | 0.9 | None |  | BHT | 0.5 |
|  |  |  | BDEGMA | 12 |  |  | BP | 1.5 |  |  |  |  |
| Example 3 | (a3) | 100 | PEMA | 37 | C-1504 | 7.7 | DMPAP | 0.9 | KF-410 | 1.5 | BHT | 0.5 |
|  |  |  | BDEGMA | 12 |  |  | BP | 1.5 |  |  |  |  |

TABLE 1-continued

| | Resin (a) | | Organic compound (b) | | Inorganic porous material (f) | | Polymerization initiator | | Organic silicon Compound (c) | | Other additives | |
|---|---|---|---|---|---|---|---|---|---|---|---|---|
| | Type | Blended amount | Type | Blended amount | Type | Blended amount | Type | Blended amount | Type | Blended amount | Type | Blended amount |
| Comparative Example 3 | (a3) | 100 | PEMA<br>BDEGMA | 37<br>12 | C-1504 | 7.7 | DMPAP<br>BP | 0.9<br>1.5 | None | | BHT | 0.5 |
| Example 4 | (a1) | 100 | LMA<br>PPMA<br>DEEHEA<br>TEGDAM<br>TMPTMA | 6<br>15<br>25<br>2<br>2 | C-1504 | 7.7 | DMPAP<br>BP | 0.9<br>1.5 | KF-160AS | 1.5 | BHT | 0.5 |
| Example 5 | (a1) | 100 | BZMA<br>CHMA<br>BDEGMA | 25<br>19<br>6 | C1504 | 7.7 | DMPAP<br>BP | 0.9<br>1.5 | SH-510 | 1.5 | BHT | 0.5 |
| Example 6 | (a1) | 100 | BZMA<br>CHMA<br>BDEGMA | 25<br>19<br>6 | CH-450 | 7.7 | DMPAP | 1.6 | KF-410 | 1.5 | BHT | 0.5 |
| Example 7 | (a1) | 100 | BZMA<br>CHMA<br>BDEGMA | 25<br>19<br>6 | C-470 | 7.7 | DMPAP<br>BP | 0.9<br>1.5 | KF-410 | 1.5 | BHT | 0.5 |

Unit of blended amount in table: parts by weight
(Description of abbreviations)
LMA: lauryl methacrylate (Mn254)
PPMA: polypropylene glycol monomethacrylate (Mn400)
DEEHEA: diethylene glycol-2-ethylhexyl methacrylate (Mn286)
TEGDMA: tetraethylene glycol dimethacrylate (Mn330)
TMPTMA: trimethylolpropane trimethacrylate (Mn339)
BZMA: benzyl methacrylate (Mn176)
CHMA: cyclohexyl methacrylate (Mn167)
BDEGMA: butoxydiethylene glycol methacrylate (Mn230)
PEMA: phenoxyethyl methacrylate (Mn206)
DMPAP: 2,2-dimethoxy-2-phenylacetophenone
BP: benzophenone
BHT: 2,6-di-butylacetophenone

TABLE 2

| | Debris residual ratio after engraving*[1] (wt %) | The number of times of wipe of debris after engraving (BEMCOT with ethanol) | Shape of dot portions | Surface frictional resistance value | Abrasion loss (mg) | Wettability test Size of spreading droplet (mm) |
|---|---|---|---|---|---|---|
| Example 1 | 8.5 | <3 | Conical and favorable | 0.85 | <0.5 | 8 |
| Comparative Example 1 | 10 | <3 | Conical and favorable | 3.25 | 62.9 | 35 |
| Example 2 | 7.5 | <3 | Conical and favorable | 0.8 | <0.5 | 10 |
| Comparative Example 2 | 9 | <3 | Conical and favorable | 3.2 | 97.5 | 37 |
| Example 3 | 9.5 | <3 | Conical and favorable | 0.9 | <0.5 | 9 |
| Comparative Example 3 | 10 | <3 | Conical and favorable | 3.3 | 113.2 | 37 |
| Example 4 | 13.0 | <3 | Conical and favorable | 1.0 | <0.5 | 9 |
| Example 5 | 10.5 | <3 | Conical and favorable | 1.2 | <0.5 | 8 |
| Example 6 | 8.0 | <3 | Conical and favorable | 1.5 | 5 | 11 |
| Example 7 | 9 | <3 | Conical and favorable | 0.9 | 5 | 9 |

*[1] debris residual rate after engraving = (weight of plate just after engraving − weight of plate after wiping out debris) ÷ (weight of original form before engraving − weight of plate just after wiping out debris) × 100

INDUSTRIAL APPLICABILITY

The present invention is most suitable for formation of a relief image for a flexographic printing plate, a letterpress printing plate or screen printing by laser engraving, formation of a pattern for surface processing such as embossing, formation of a relief image for printing of a tile or the like, formation of a pattern of a conductor, a semiconductor or an insulator of an electronic component, formation of a pattern of a functional material such as an antireflection film of an optical component, a color filter or a (near) infrared cut filter, and further, coating and formation of a pattern of an alignment layer, a ground layer, a luminescent layer, an electron transport layer or a sealing material layer in production of a display element of a liquid crystal display, an organic electroluminescence display or the like, or a roll for adjusting the amount of ink, which is used in contact with an ink transferring blanket or an anilox roll which does not form a pattern.

The invention claimed is:

1. A laser engravable printing substrate comprising a photo-cured pattern-free product of a photosensitive resin composition, wherein the photosensitive resin composition comprises a resin (a) having a polymerizable unsaturated group having a number average molecular weight of 1000 or more and 200000 or less, an organic compound (b) having a polymerizable unsaturated group having a number average molecular weight of less than 1000, and an organic silicon compound (c) having at least one Si—O bond in a molecule and having no polymerizable unsaturated group in the molecule, and having at least one organic group selected from the group consisting of a methylstyryl group, a styryl group and a carbinol group, wherein a content of the organic silicon compound (c) is 0.1 wt % or more and 10 wt % or less based on the total amount of the photosensitive resin composition.

2. The laser engravable printing substrate according to claim 1, wherein the organic silicon compound (c) has a number average molecular weight of 100 or more and 100000 or less, and is liquid at 20° C.

3. The laser engravable printing substrate according to claim 1, wherein the photosensitive resin composition further comprises a photopolymerization initiator, wherein the photopolymerization initiator comprises at least one hydrogen extraction photopolymerization initiator (d).

4. The laser engravable printing substrate according to claim 1, wherein the photopolymerization initiator comprises at least one hydrogen extraction photopolymerization initiator (d) and at least one degradable photopolymerization initiator (e).

5. The laser engravable printing substrate according to claim 4, wherein the hydrogen extraction photopolymerization initiator (d) comprises at least one compound selected from the group consisting of benzophenones, xanthenes and anthraquinones, and the degradable photopolymerization initiator (e) comprises at least one compound selected from the group consisting of benzoin alkyl ethers, 2,2-dialkoxy-2-phenylacetophenones, acyloxime esters, azo compounds, organic sulfur compounds and diketones.

6. The laser engravable printing substrate according to claim 1, wherein the resin (a) is liquid at 20° C., and the resin (a) and/or the organic compound (b) are compounds having a molecular chain having at least one bond selected from a carbonate bond, an ester bond and an ether bond, and/or having at least one molecular chain selected from the group consisting of an aliphatic saturated hydrocarbon chain and an aliphatic unsaturated hydrocarbon chain, and having an urethane bond.

7. The laser engravable printing substrate according to claim 1, wherein a haze of the photosensitive resin composition is 0% or more and 70% or less when it is in the form of a layer having a thickness of 1 mm.

8. The laser engravable printing substrate according to claim 1, wherein the photosensitive resin composition is liquid at 20° C.

9. The laser engravable printing substrate according to claim 1, wherein the photosensitive resin composition further comprises a photopolymerization initiator, wherein the photopolymerization initiator comprises at least one degradable photopolymerization initiator (e).

10. The laser engravable printing substrate according to claim 4, wherein the hydrogen extraction photopolymerization initiator (d) is a benzophenone, and the degradable photopolymerization initiator (e) is 2,2-dialkoxy-2-phenylacetophenone.

* * * * *